(12) United States Patent
Hoshi et al.

(10) Patent No.: US 7,682,927 B2
(45) Date of Patent: Mar. 23, 2010

(54) METHOD OF MANUFACTURING SEMICONDUCTOR DEVICE

(75) Inventors: Takeshi Hoshi, Yokohama (JP); Masahiro Kiyotoshi, Sagamihara (JP); Atsuko Kawasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/387,854

(22) Filed: Mar. 24, 2006

(65) Prior Publication Data
US 2006/0246684 A1 Nov. 2, 2006

(30) Foreign Application Priority Data

Mar. 25, 2005 (JP) ............................. 2005-088177
Nov. 22, 2005 (JP) ............................. 2005-336773

(51) Int. Cl.
*H01L 21/76* (2006.01)

(52) U.S. Cl. ................. 438/424; 438/787; 257/E21.546

(58) Field of Classification Search ......... 438/424–436, 438/787; 257/E21.546, E21.548
See application file for complete search history.

(56) References Cited

U.S. PATENT DOCUMENTS

| | | | |
|---|---|---|---|
| 6,191,002 B1 * | 2/2001 | Koyanagi | .................... 438/431 |
| 6,566,229 B2 * | 5/2003 | Hong et al. | ................. 438/435 |
| 6,635,586 B2 | 10/2003 | Goo et al. | |
| 6,869,860 B2 | 3/2005 | Belyansky et al. | |
| 2004/0072429 A1 | 4/2004 | Hieda et al. | |
| 2005/0116300 A1 | 6/2005 | Hieda et al. | |
| 2006/0102977 A1 * | 5/2006 | Fucsko et al. | ............... 257/499 |

FOREIGN PATENT DOCUMENTS

| | | |
|---|---|---|
| JP | 2000-114362 | 4/2000 |
| JP | 2001-308090 A | 11/2001 |
| JP | 2002-367980 | 12/2002 |
| JP | 2003-31650 | 1/2003 |
| JP | 2004-179614 | 6/2004 |
| JP | 2004-241751 A | 8/2004 |

OTHER PUBLICATIONS

Kiyotoshi, et al.: "Semiconductor Device and Method of Manufacturing the Same"; U.S. Appl. No. 11/285,156, filed Nov. 23, 2005.
Notification of Reasons for Rejection mailed Mar. 3, 2009 from the Japan Patent Office in Japanese Application No. 2005-088177 and English language translation thereof.

* cited by examiner

*Primary Examiner*—Brook Kebede
(74) *Attorney, Agent, or Firm*—Finnegan, Henderson, Farabow, Garrett & Dunner, L.L.P.

(57) ABSTRACT

A method for manufacturing a semiconductor device includes coating a solution containing a perhydrosilazane polymer on a substrate, heating the solution to form a film containing the perhydrosilazane polymer, and oxidizing the film in a water vapor atmosphere at a reduced pressure to convert the film into an insulating film containing silicon and oxygen.

20 Claims, 21 Drawing Sheets

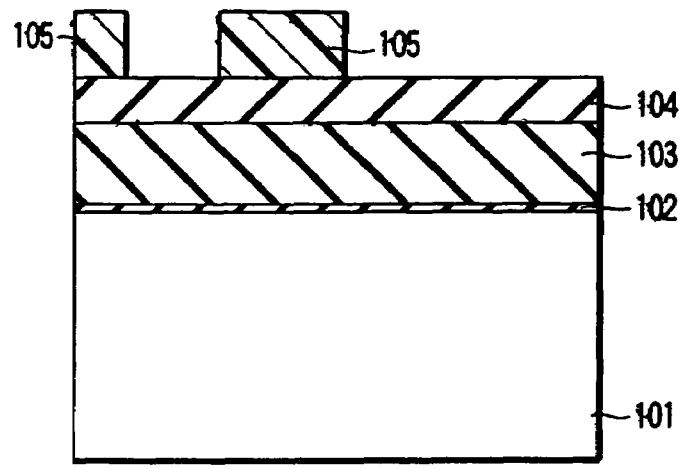
F I G. 1
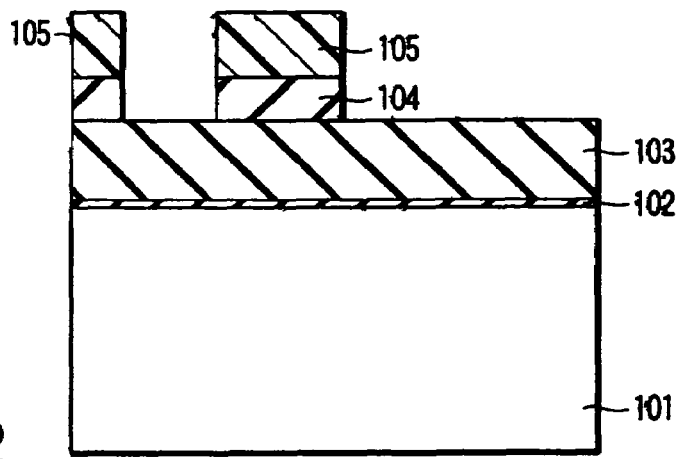
F I G. 2
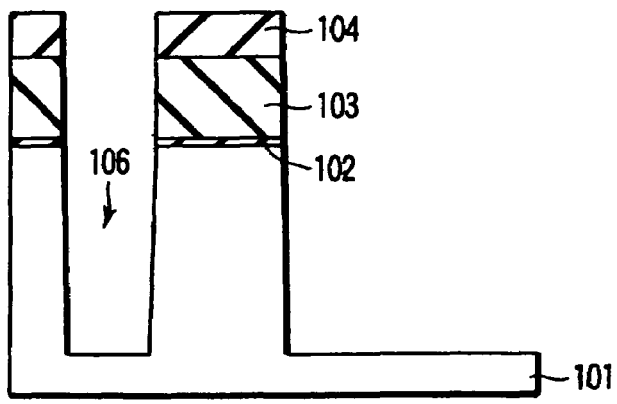
F I G. 3

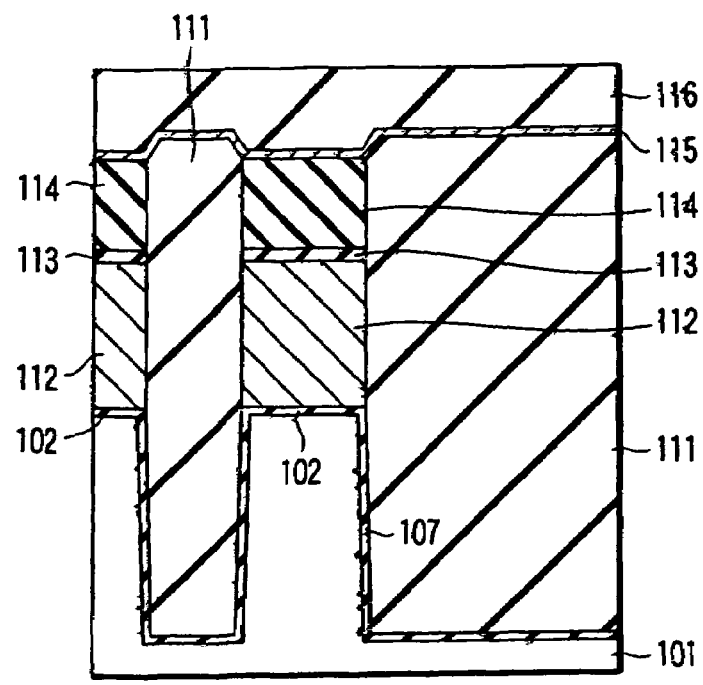
F I G. 10
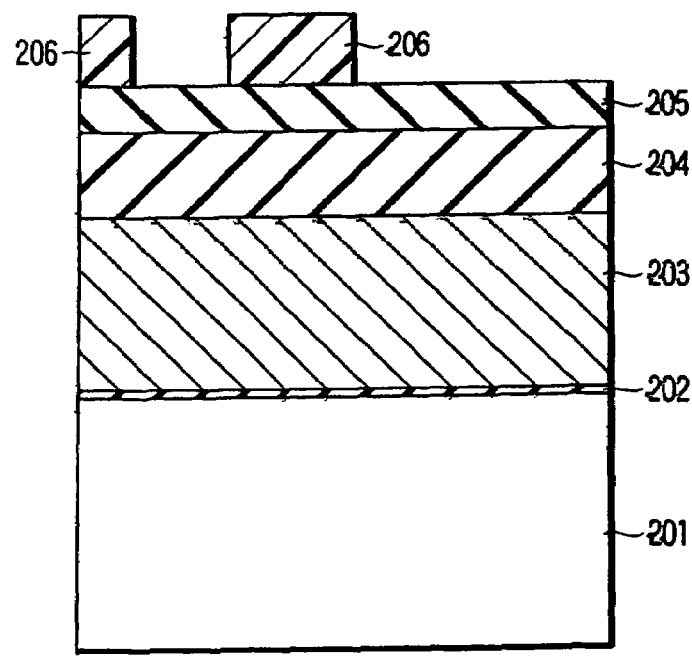
F I G. 11

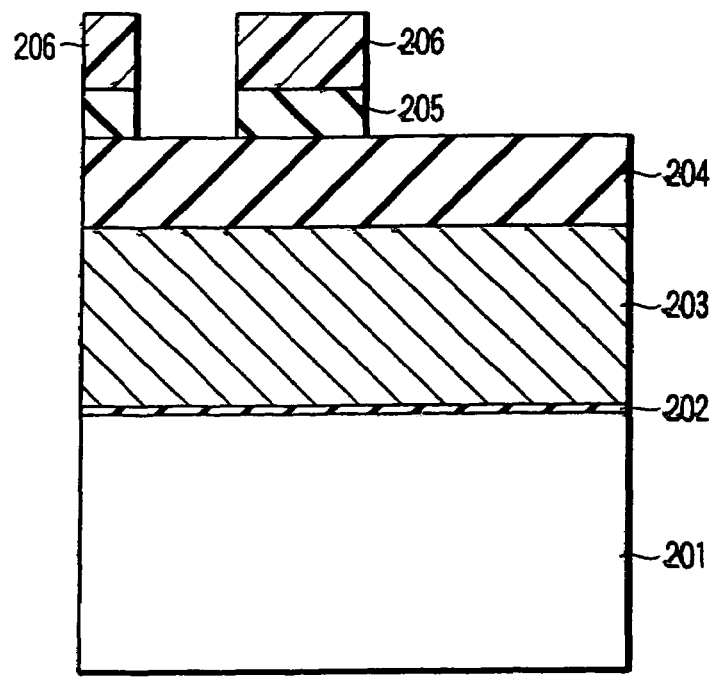
F I G. 12
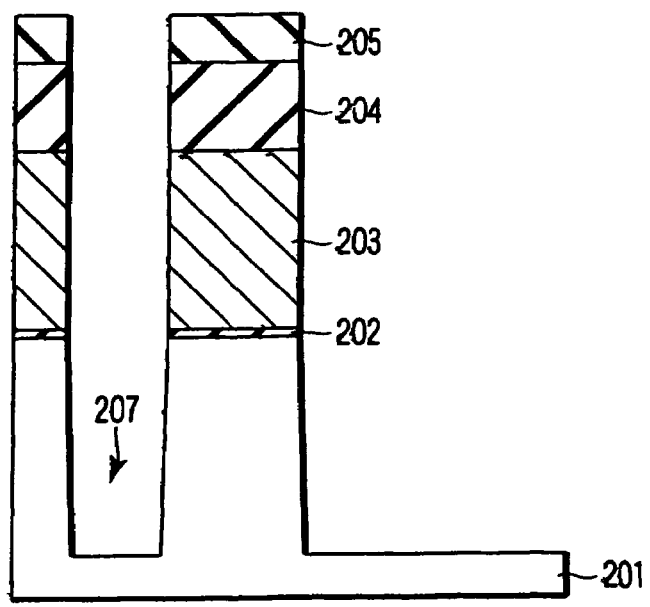
F I G. 13

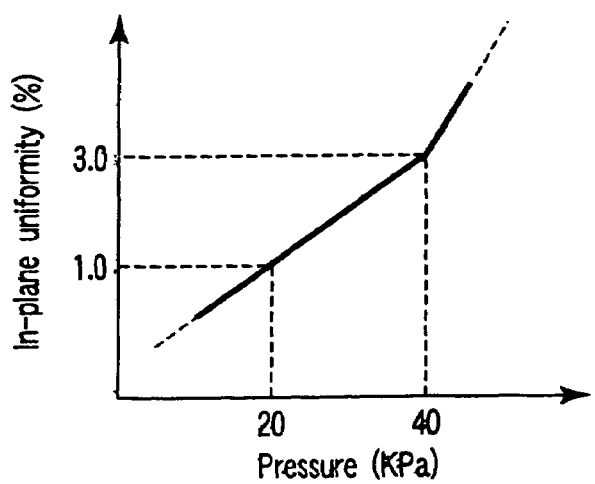
F I G. 22
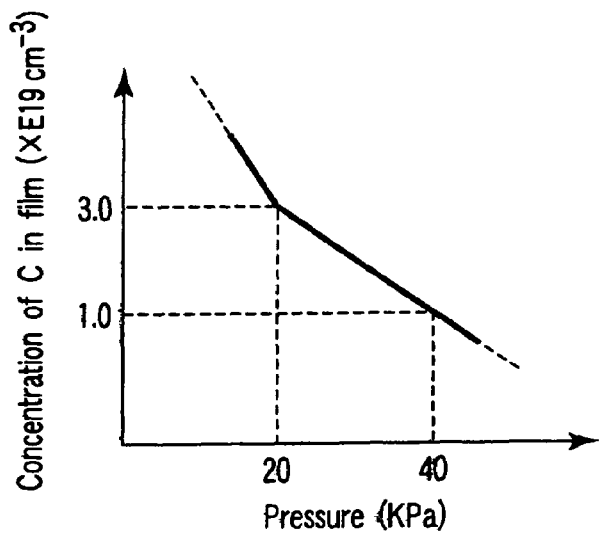
F I G. 23
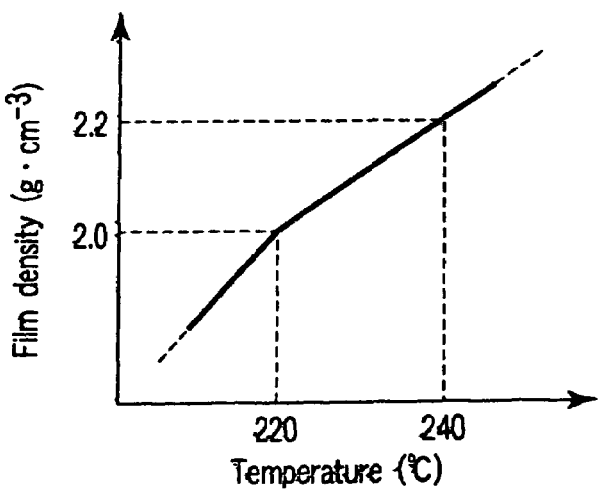
F I G. 24

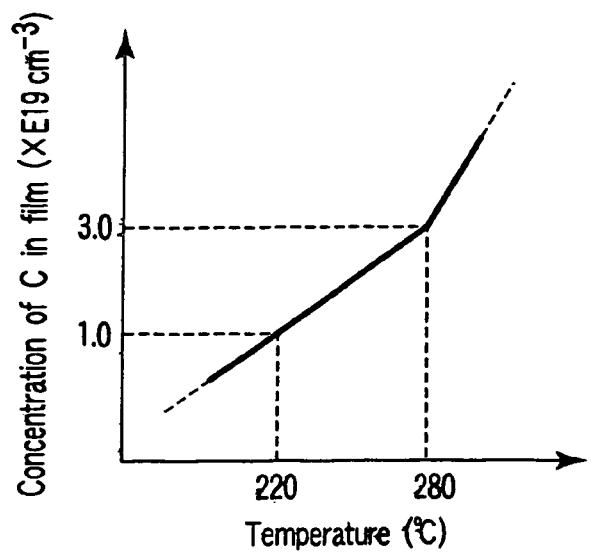
F I G. 25
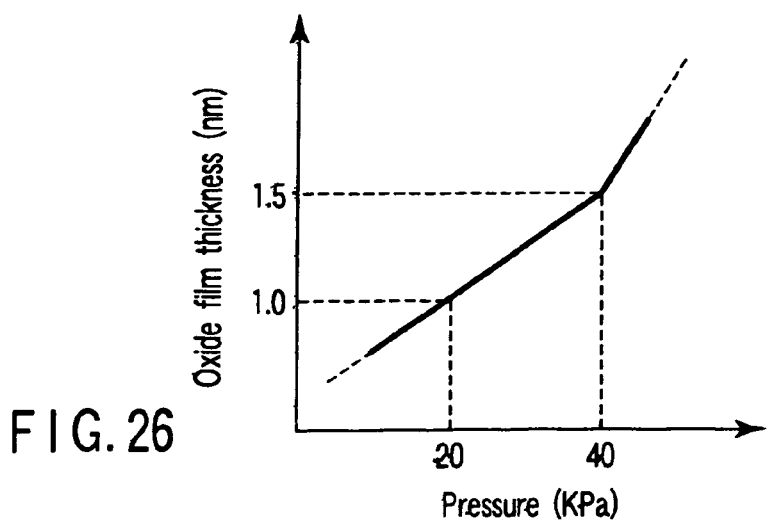
F I G. 26
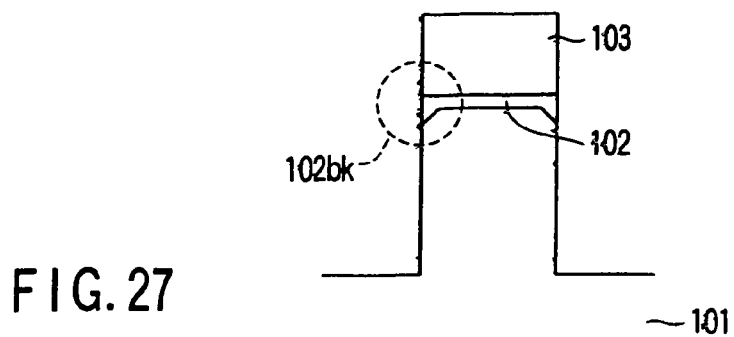
F I G. 27

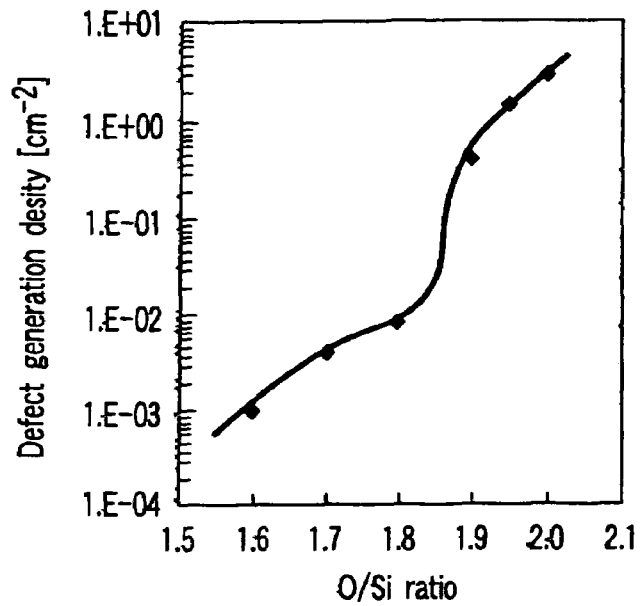
FIG. 38
| | Embodiment | Comprative example |
|---|---|---|
| Memory cell transistor threshold voltage | -0.5oV±0.15V [@0.2uA/Cell] | -0.57V±0.20V [@0.2uA/Cell] |
FIG. 39
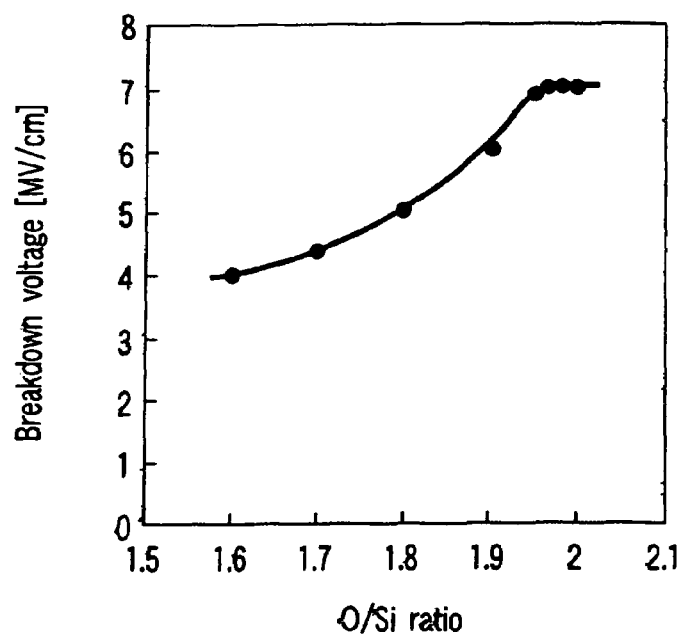
FIG. 40

| | Embodiment | Comparative example |
|---|---|---|
| Memory cell transistor threshold voltage | −0.50V±0.15V [@0.2uA/Cell] | −0.53V±0.19V [@0.2uA/Cell] |
FIG. 47
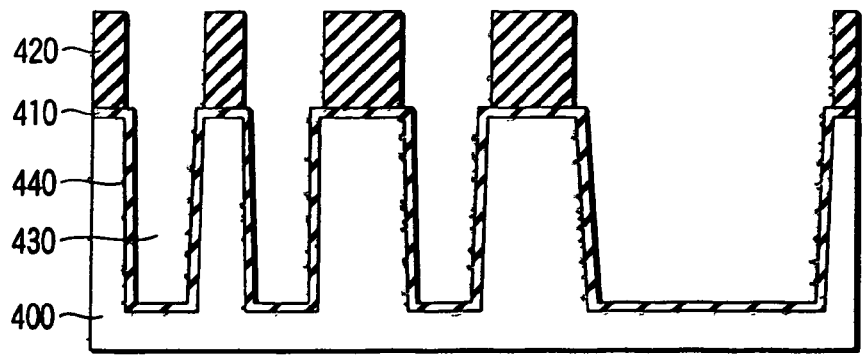
FIG. 48
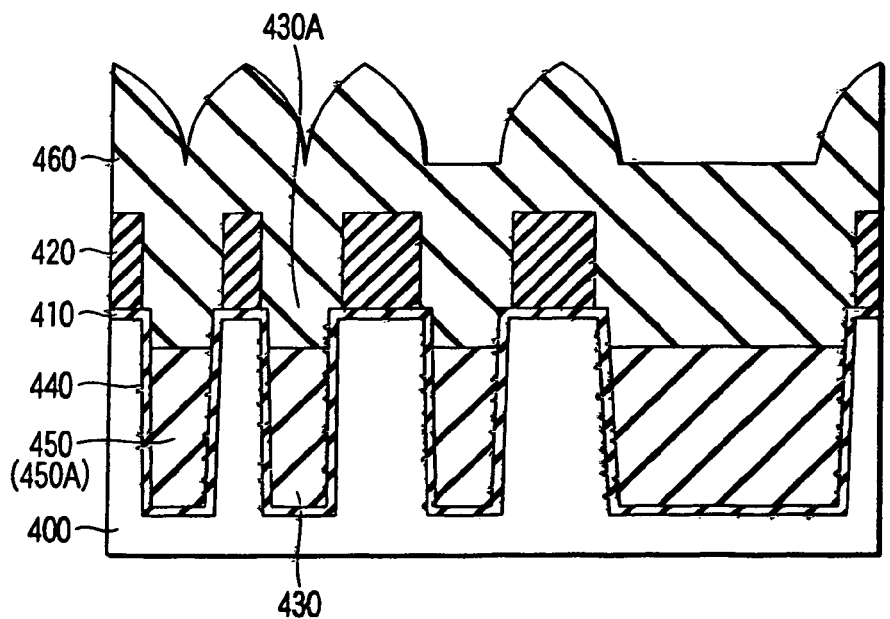
FIG. 49

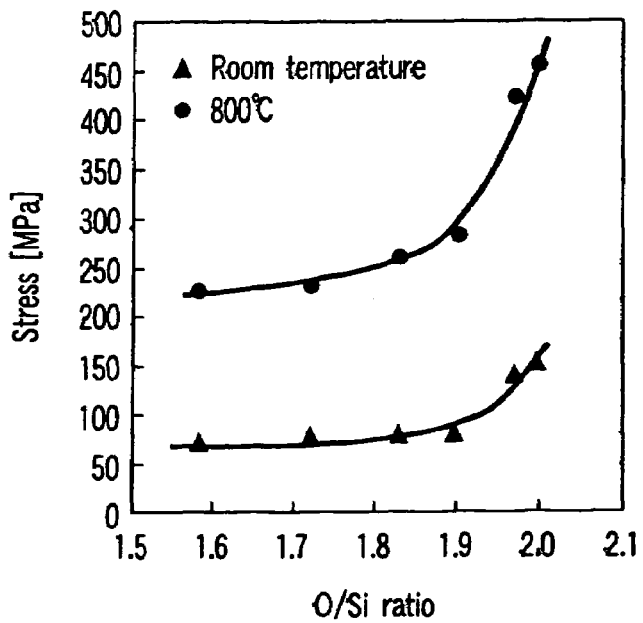
F I G. 51
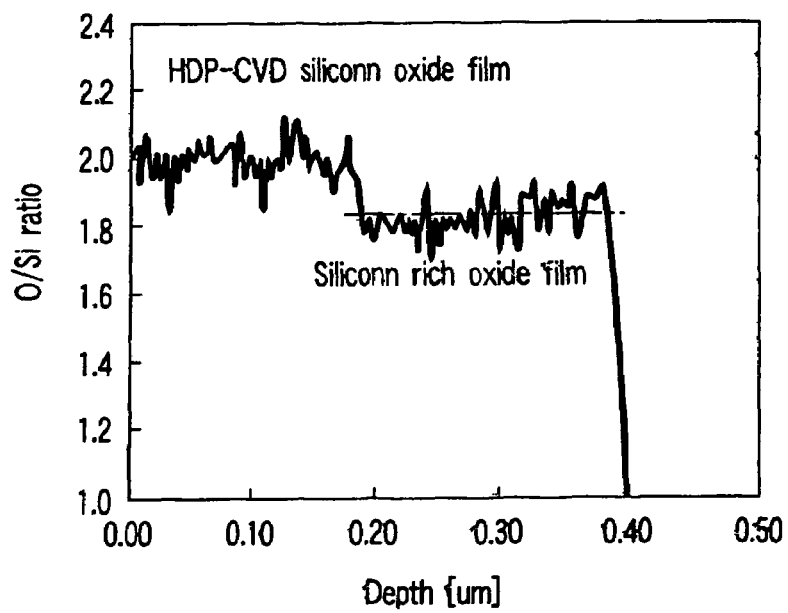
F I G. 52
| | Embodiment | Comparative example |
|---|---|---|
| Memory cell transistor threshold voltage | 0.15V ±0.01V [@0.2uA/Cell] | 0.14V ±0.02V [@0.2uA/Cell] |
F I G. 53

METHOD OF MANUFACTURING
SEMICONDUCTOR DEVICE

CROSS-REFERENCE TO RELATED
APPLICATIONS

This application is based upon and claims the benefit of priority from the prior Japanese Patent Application No. 2005-088177, Mar. 25, 2005; and No. 2005-336773, Nov. 22, 2005, the entire contents of which are incorporated herein by reference.

BACKGROUND OF THE INVENTION

1. Field of the Invention

The present invention relates to a method for manufacturing a semiconductor device which method involves using a solution containing a perhydrosilazane polymer to form an insulating film containing silicon and oxygen.

2. Description of the Related Art

A reduction in the size of LSIs is intended to increase the components per chip to improve the performance of devices (for example, an increase in operating speed and a reduction in power consumption) and to reduce manufacture costs. The recent minimum design rule is nearly 0.1 micron on a mass production level. A further reduction in the size of LSIs is difficult but the design rule is expected to be further reduced to 0.1 micron or less in the future. A Logic device of gate length as small as about 30 nm has been produced at the experimental stage.

To increase the components per chip, it is important to reduce the size of isolation areas that occupy most of the element area. In recent years, an STI (Shallow Trench Isolation) technique has been adopted as a method of forming very small isolation areas. The STI technique forms an isolation area by filling an insulating film (isolation insulating film) into a trench (isolation trench) formed by anisotropic etching.

The STI technique has realized an isolation region with a trench of width about 90 to 70 nm, which corresponds to a minimum machining dimension of at most 0.1 micron. For memories, which require the highest components density, the width of an active area for a transistor or an isolation area has recently been nearly 90 to 70 nm, which corresponds to a minimum machining dimension of at most 0.1 micron. Accordingly, a reduction in the size of the memory isolation area has also become important.

The difficulty in the formation of an isolation area has been increasing with decreasing LSI size. The reason is as follows. The capability of separating elements from each other is determined by the effective distance between adjacent elements. The effective distance is determined by the minimum distance of peripheral length of the isolation trench from one of its sidewalls through its bottom surface to the other sidewall. To avoid degrading the isolation capability in spite of a reduction in the size of devices, it is necessary to keep the effective distance at least a conventional value, that is, to almost fix the depth of the isolation trench. The width of the isolation trench decreases consistently with the LSI size. The aspect ratio of the isolation trench increases with progression of the generation of size reduction. This causes the difficulty in the formation of an isolation area to increase with decreasing LSI size.

A high density plasma (HDP) CVD process is a currently standard technique for forming an isolation insulating film. If the HDP-CVD process is used to form a silicon oxide film (HDP silicon oxide film) in an isolation trench of the 0.1 micron generation or earlier, the aspect ratio reaches at least 3.

It is thus very difficult to form an HDP silicon oxide film free from a void (unfilled part), in the isolation trench. The presence of a void in the HDP silicon oxide film in the isolation trench may degrade insulating properties.

A currently promising technique for filling a very small isolation trench is a method of filling the isolation trench with a spin on glass (SOG) film formed by a spin coating method or a flowable insulating film such as an $O_3$/TEOS film or a method of filling the isolation trench with the conventional HDP silicon oxide film and the flowable insulating film.

A known filling technique using the flowable insulating film is a method of coating a solution containing a perhydrosilazane polymer (polysilazane) on a silicon substrate in which isolation trenches are formed, filling the polysilazane film into the isolation trenches, and then using a diffusion furnace to heat the polysilazane film in a water vapor atmosphere to convert the polysilazane film into a silicon oxide film (Jpn. Pat. Appln. KOKAI Publication Nos. 2004-179614 and 2002-367980).

Impurities remain in the silicon oxide film formed by the above method; the impurities include nitrogen (N) contained in the material and carbon (C) contained in an organic solvent such as dibutylether. The impurities remaining in the silicon oxide film act as plus fixed charges. The fixed charges may degrade the insulating properties of the silicon oxide film.

BRIEF SUMMARY OF THE INVENTION

According to an aspect of the present invention, there is provided a method for manufacturing a semiconductor device comprising: coating a solution containing a perhydrosilazane polymer on a substrate; heating the solution to form a film containing the perhydrosilazane polymer; and oxidizing the film in a water vapor atmosphere at a reduced pressure to convert the film into an insulating film containing silicon and oxygen.

According to another aspect of the present invention, there is provided a method for manufacturing a semiconductor device comprising: forming an isolation trench in a surface of a semiconductor substrate; coating a solution containing a perhydrosilazane polymer on the semiconductor substrate to fill the isolation trench with the solution; heating the solution to form a film containing the perhydrosilazane polymer and which fills the isolation trench; and oxidizing the film in a water vapor atmosphere at a reduced pressure to convert the film into an insulating film containing silicon and oxygen.

BRIEF DESCRIPTION OF THE SEVERAL
VIEWS OF THE DRAWING

FIG. 1 is a sectional view illustrating a method for manufacturing a semiconductor device in accordance with a first embodiment;

FIG. 2 is a sectional view continued from FIG. 1 and illustrating the method for manufacturing a semiconductor device in accordance with the first embodiment;

FIG. 3 is a sectional view continued from FIG. 2 and illustrating the method for manufacturing a semiconductor device in accordance with the first embodiment;

FIG. 10 is a sectional view showing a semiconductor device in accordance with the first embodiment;

FIG. 11 is a sectional view illustrating a method for manufacturing a semiconductor device in accordance with a second embodiment;

FIG. 12 is a sectional view continued from FIG. 11 and illustrating the method for manufacturing a semiconductor device in accordance with the second embodiment;

FIG. 13 is a sectional view continued from FIG. 12 and illustrating the method for manufacturing a semiconductor device in accordance with the second embodiment;

FIG. 22 is a diagram showing the relationship between pressure and the in-plane uniformity of thickness of an oxide film formed by oxidizing a bare silicon wafer in a water vapor atmosphere;

FIG. 23 is a diagram showing the relationship between pressure and the C concentration of the oxide film formed by oxidizing the polysilazane film in the water vapor atmosphere;

FIG. 24 is a diagram showing the relationship between temperature and the density of the oxide film formed by oxidizing the polysilazane film the bare silicon wafer in the water vapor atmosphere;

FIG. 25 is a diagram showing the relationship between temperature and the C concentration of the oxide film formed by oxidizing the polysilazane film the bare silicon wafer in the water vapor atmosphere;

FIG. 26 is a diagram showing the relationship between pressure and the thickness of the oxide film formed by oxidizing the bare silicon wafer in the water vapor atmosphere;

FIG. 27 is a sectional view showing a gate bird's beak obtained when a gate is formed later;

FIG. 38 is a diagram illustrating the relationship between ratio of oxygen to silicon in a film and defect generation density;

FIG. 39 is a diagram illustrating threshold voltage of a memory cell transistor in the third embodiment and in a comparative example;

FIG. 40 is a diagram illustrating relationship between ratio of oxygen to silicon in a film and breakdown voltage;

FIG. 47 is a diagram illustrating threshold voltage of a memory cell transistor in the fourth embodiment and in a comparative example;

FIG. 48 is a cross sectional view showing the sectional structure of an element by a step of a method for manufacturing a semiconductor device according to a fifth embodiment;

FIG. 49 is a cross sectional view showing the sectional structure of the element by a step of the method for manufacturing the semiconductor device;

FIG. 51 is a diagram illustrating relationship between ratio of oxygen to silicon in a film and stress;

FIG. 52 is a diagram illustrating relationship between substrate depth and ratio of oxygen to silicon in a film; and FIG. 53 is a diagram illustrating threshold voltage of a memory cell transistor in the fifth embodiment and in a comparative example.

DETAILED DESCRIPTION OF THE INVENTION

Figure 4:
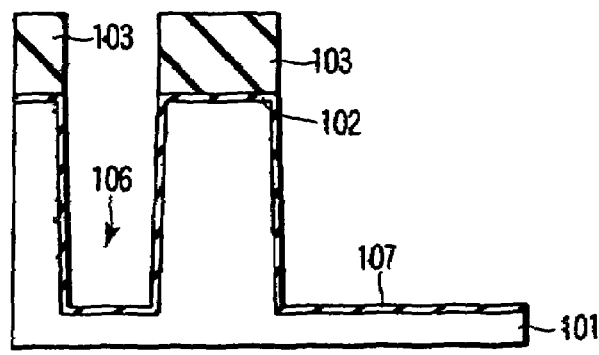
FIG. 4 is a sectional view continued from FIG. 3 and illustrating the method for manufacturing a semiconductor device in accordance with the first embodiment.
Figure 5:
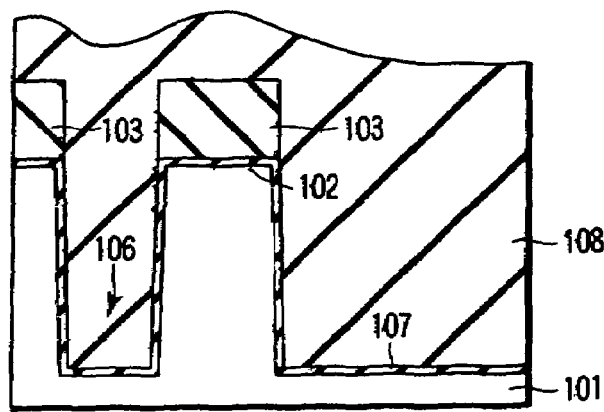
FIG. 5 is a sectional view continued from FIG. 4 and illustrating the method for manufacturing a semiconductor device in accordance with the first embodiment.
Figure 6:
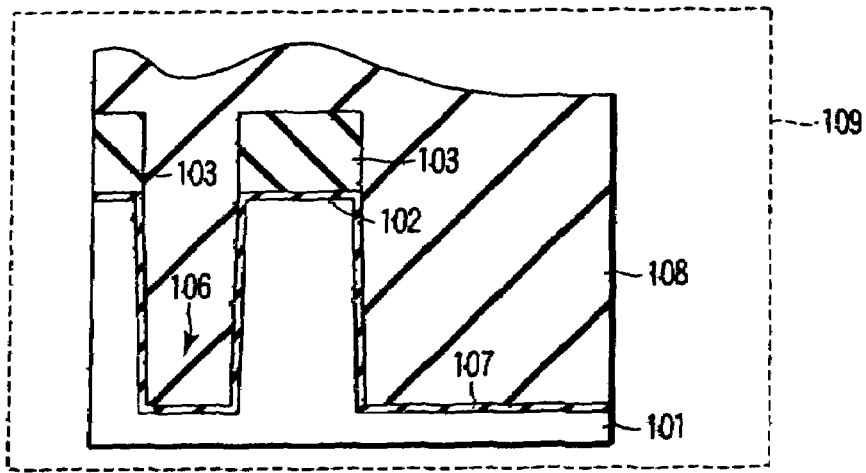
FIG. 6 is a sectional view continued from FIG. 5 and illustrating the method for manufacturing a semiconductor device in accordance with the first embodiment.
Figure 7:
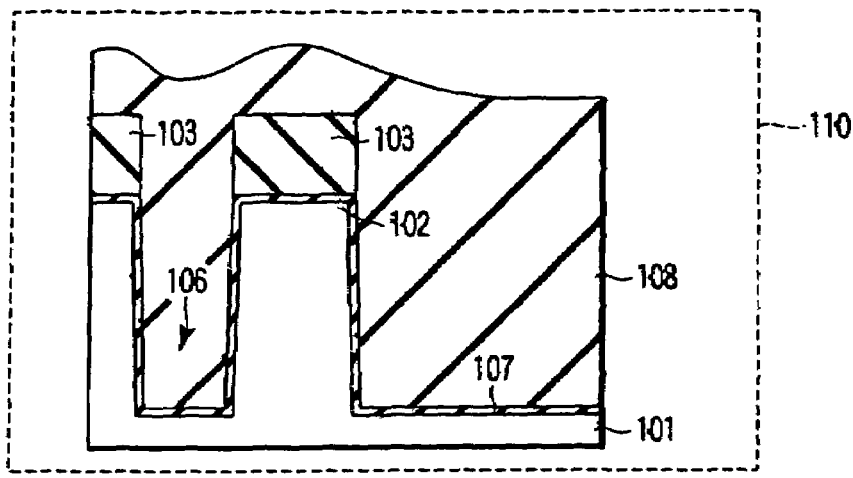
FIG. 7 is a sectional view continued from FIG. 6 and illustrating the method for manufacturing a semiconductor device in accordance with the first embodiment.
Figure 8:
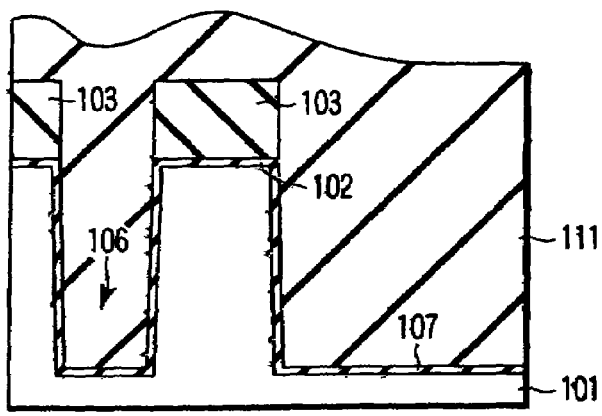
FIG. 8 is a sectional view continued from FIG. 7 and illustrating the method for manufacturing a semiconductor device in accordance with the first embodiment.
Figure 9:
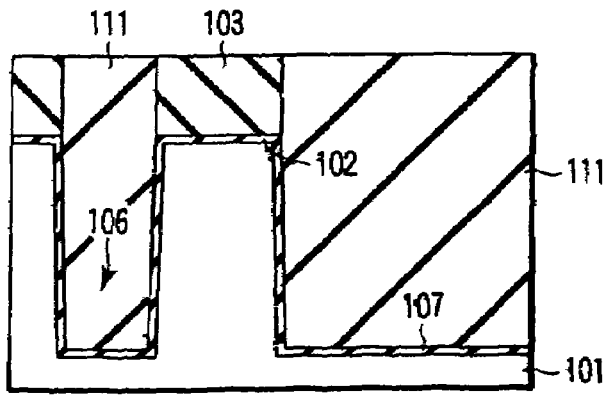
FIG. 9 is a sectional view continued from FIG. 8 and illustrating the method for manufacturing a semiconductor device in accordance with the first embodiment.
Figure 14:
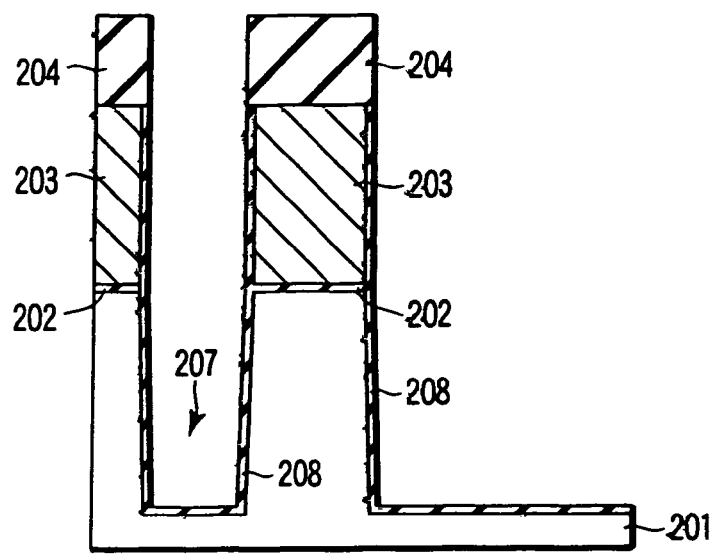
FIG. 14 is a sectional view continued from FIG. 13 and illustrating the method for manufacturing a semiconductor device in accordance with the second embodiment.
Figure 15:
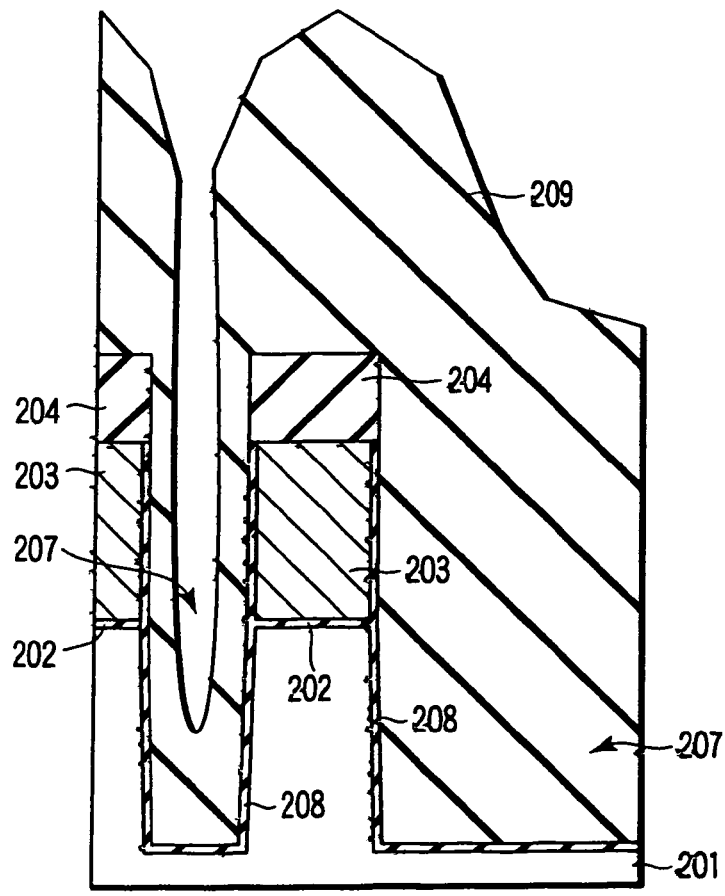
FIG. 15 is a sectional view continued from FIG. 14 and illustrating the method for manufacturing a semiconductor device in accordance with the second embodiment.
Figure 16:
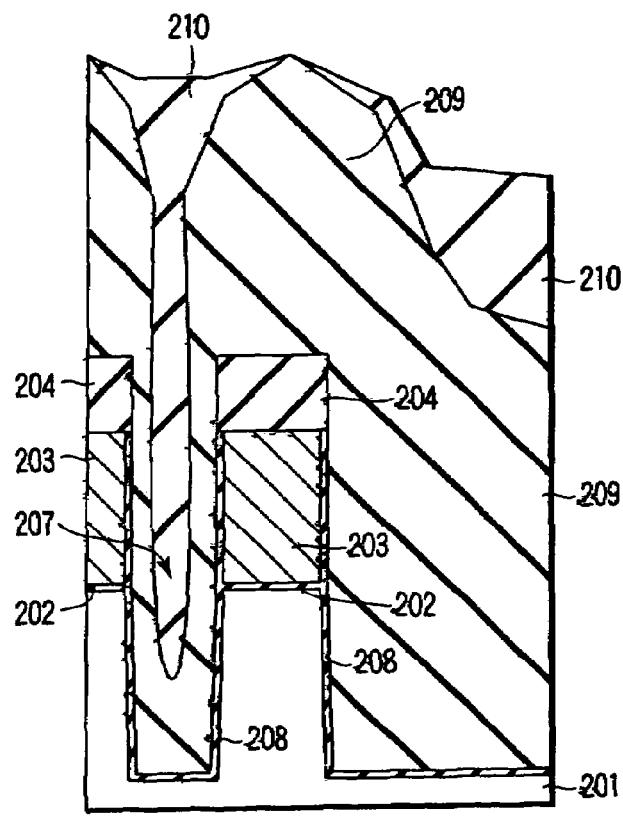
FIG. 16 is a sectional view continued from FIG. 15 and illustrating the method for manufacturing a semiconductor device in accordance with the second embodiment.
Figure 17:
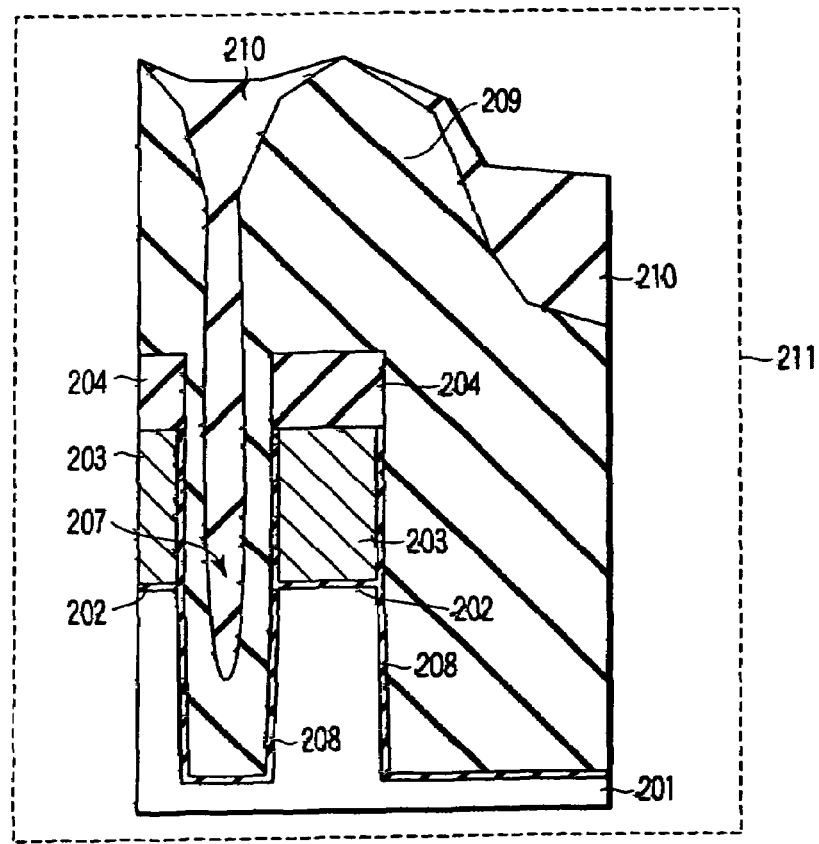
FIG. 17 is a sectional view continued from FIG. 16 and illustrating the method for manufacturing a semiconductor device in accordance with the second embodiment.

Embodiments of the present invention will be described below with reference to the drawings.

First Embodiment

FIGS. 1 to 9 are sectional views illustrating a method for manufacturing a semiconductor device in accordance with a first embodiment. FIGS. 1 to 9 are sectional views of a transistor taken across the channel width.

In the present embodiment, description will be given of a process of forming an isolation trench before forming a gate (gate oxide film and floating gate electrode) of a transistor.

[FIG. 1]

A gate oxide film 102, a silicon nitride film 103, a CVD silicon oxide film 104, and a resist pattern 105 are sequentially formed on a silicon substrate 101. The gate oxide film 102 is a thermal oxide film. The gate oxide film 102 has a thickness of, for example, 5 nm. The silicon nitride film 103 has a thickness of, for example, 150 nm. The silicon nitride film 103 is used as a polishing stopper during a CMP (Chemical Mechanical Polishing) process.

[FIG. 2]

The resist pattern 105 is used as a mask to etch the CVD silicon oxide film 104 by an RIE (Reactive Ion Etching) process. The etched CVD silicon oxide film 104 is used as a hard mask.

[FIG. 3]

The resist pattern 105 is removed by an asher process and a wet process using a mixture of sulfuric acid and hydrogen peroxide. The CVD silicon oxide film 104 is used as a mask to sequentially etch the silicon nitride film 103, gate oxide film 102, and silicon substrate 101 by the RIE process. A trench 106 is thus formed in a surface of the silicon substrate 101. The trench 106 has a depth of, for example, 300 nm.

[FIG. 4]

Hydrofluoric vapor is used to selectively remove the CVD silicon oxide film 104. A thermal oxide film 107 is formed on an inner surface of the trench 106. The thermal oxide film 107 has a thickness of, for example, 4 nm. The above steps result in an isolation trench including the trench 106 and the thermal oxide film 107.

[FIG. 5]

A spin coating method is used to form a polysilazane film 105 all over the surface of the substrate. A detailed description will be given of a method of forming a polysilazane film 108.

A perhydrosilazane polymer [SiH$_2$ NH]n is dispersed in a solvent of xylene, dibutylether, or the like to generate a perhydrosilazane polymer solution.

The spin coating method is used to coat the perhydrosilazane polymer solution on the silicon substrate 101 to form a coating film containing the perhydrosilazane polymer solution. Since the coating film is formed by coating the perhydrosilazane polymer solution, the coating film is filled into the isolation trench of a high aspect ratio without forming any voids (unfilled parts) or seams (unconnected parts like slits).

The conditions for the formation of a coating film by the spin coating method are, for example, as follows: the speed at which the silicon substrate 101 is spun: 4,000 rpm, spin time: 30 seconds, the amount of perhydrosilazane polymer solution dropped: 8 cc, and target coating film thickness: 500 nm.

After the formation of the coating film, the silicon substrate 101 is heated to 180° C. using a hot plate. Subsequently, the silicon substrate 101 is baked in an inert gas atmosphere for three minutes. This causes the solvent in the perhydrosilazane polymer solution to be volatilized to convert the coating film into a polysilazane film 108. In this stage, polysilazane film 108 contains about several to over 10 percents of carbon or hydrocarbon resulting from the solvent, as impurities.

Then, the silicon substrate 101 is introduced into a diffusion furnace at a temperature of about 200° C. The temperature in the diffusion furnace is increased to a predetermined temperature (220 to 280° C.). Once the temperature in the diffusion furnace reaches the predetermined value, the diffusion furnace stands by for, for example, at least five minutes in order to stabilize the temperature. This improves the uniformity of the temperature in the plane of a wafer and within a batch.

[FIG. 6]

Water vapor is introduced into the diffusion furnace. In a water vapor atmosphere 109 that meets predetermined conditions, a first oxidation treatment is executed on the polysilazane film 108. The pressure (partial pressure) of the water vapor in the water vapor atmosphere 109 is 20 to 40 KPa. The water vapor atmosphere 109 is at a temperature of 220 to 280° C. Treatment time is, for example, about one hour.

FIG. 22 is a diagram showing the relationship between pressure and the in-plane uniformity of thickness of an oxide film formed by oxidizing a bare silicon wafer in the water vapor atmosphere. FIG. 22 shows that a pressure of more than 40 KPa rapidly reduces the in-plane uniformity. The pressure of more than 40 KPa rapidly increases the amount of oxygen around the periphery of the wafer. This leads to a reduction in the in-plane uniformity. The present embodiment thus sets the pressure for the first oxidation treatment at most 40 KPa.

FIG. 23 is a diagram showing the relationship between pressure and the C concentration of the oxide film formed by oxidizing the polysilazane film in the water vapor atmosphere. FIG. 23 shows that a pressure of less than 20 KPa rapidly raises the C concentration, which increases above $3 \times 10^{19}$ cm$^{-3}$. Since C in the oxide film acts as fixed charges, such a high C concentration may degrade the electrical characteristics or reliability of transistors in a memory cell. In particular, flat band voltage (Vfb) shifts markedly occur in the transistors. The Vfb shift is problematic if a gate dielectric film is a high-k dielectric film, that is, if the size of elements is further reduced. The present embodiment accordingly sets the pressure for the first oxidation treatment at least 20 KPa.

FIG. 24 is a diagram showing the relationship between temperature and the density of the oxide film formed by oxidizing the polysilazane film in the water vapor atmosphere. FIG. 24 shows that a temperature of lower than 220° C. rapidly reduces the density (film density) of the oxide film. A decrease in film density may reduce wet etching resistance and CMP resistance. The present embodiment accordingly sets the temperature for the first oxidation treatment at least 220° C.

FIG. 25 is a diagram showing the relationship between temperature and the C concentration of the oxide film formed by oxidizing the polysilazane film in the water vapor atmosphere. FIG. 25 shows that a temperature of higher than 280° C. rapidly increases the C concentration of the oxide film. During the oxidization in the water vapor atmosphere 109, C needs to be removed before the oxidization (contraction) of the film progresses. High temperature prevents C from being removed from the oxide film. The present embodiment accordingly sets the temperature for the first oxidation treatment at most 280° C.

[FIG. 7]

After the oxidation treatment (first oxidation treatment) in the water vapor atmosphere 109, the temperature in the diffusion furnace is further increased. A second oxidation treatment is then executed on the polysilazane film 108 in a water vapor atmosphere 110 that meets predetermined conditions. The pressure (partial pressure) of the water vapor in the water vapor atmosphere 110 is 20 to 40 KPa. The water vapor atmosphere 110 is at a temperature of 500 to 580° C. The process time is, for example, about 10 minutes.

The present embodiment executes the first and second oxidation treatments in the same diffusion furnace. This reduces the treatment time to improve productivity. The present embodiment further uses a batch type processing equipment to execute the first and second oxidation treatments. This increases the throughput per unit time.

FIG. 26 is a diagram showing the relationship between pressure and the thickness of the oxide film (oxide film thickness) formed by oxidizing the bare silicon wafer in the water vapor atmosphere. FIG. 26 shows that a pressure of more than 40 KPa rapidly increases the oxide film thickness. A rapid increase in oxide film thickness means the oxidation of peripheral structure (for example, an active area) of the polysilazane film. Specifically, as shown in FIG. 27, an edge of the gate oxide film 102 is oxidized, resulting in an increase the thickness of the edge (gate bird's beak) 102*bk*. The gate bird's beak 102*bk* prevents a reduction in the size of elements. The present embodiment accordingly sets the upper limit on the pressure for the second oxidation treatment at most 40 KPa.

Figure 18:
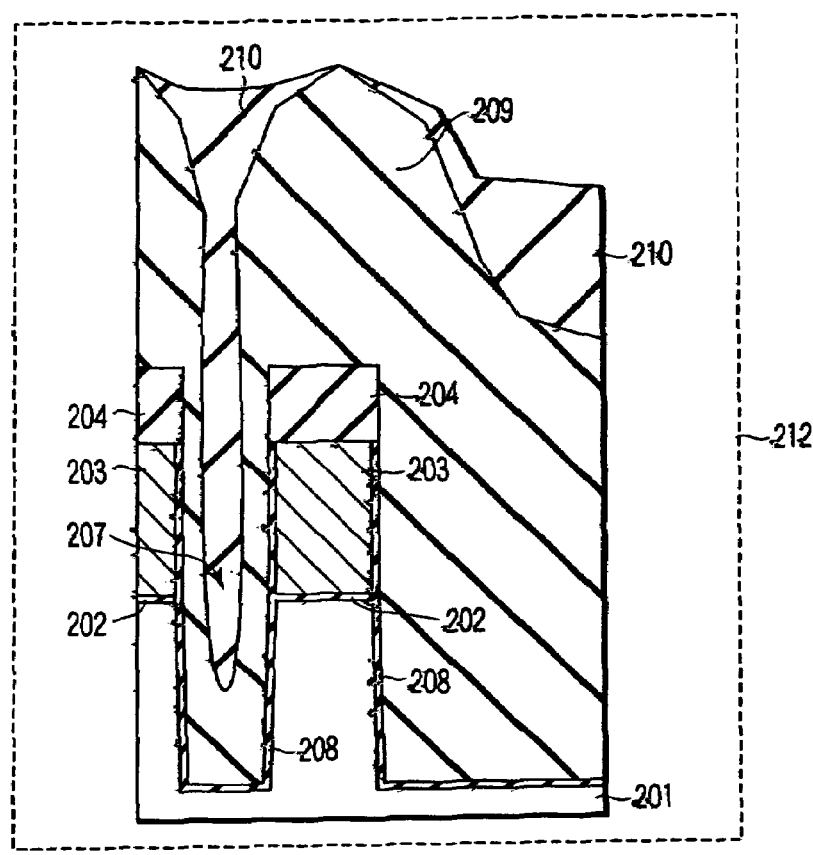
FIG. 18 is a sectional view continued from FIG. 17 and illustrating the method for manufacturing a semiconductor device in accordance with the second embodiment.
Figure 19:
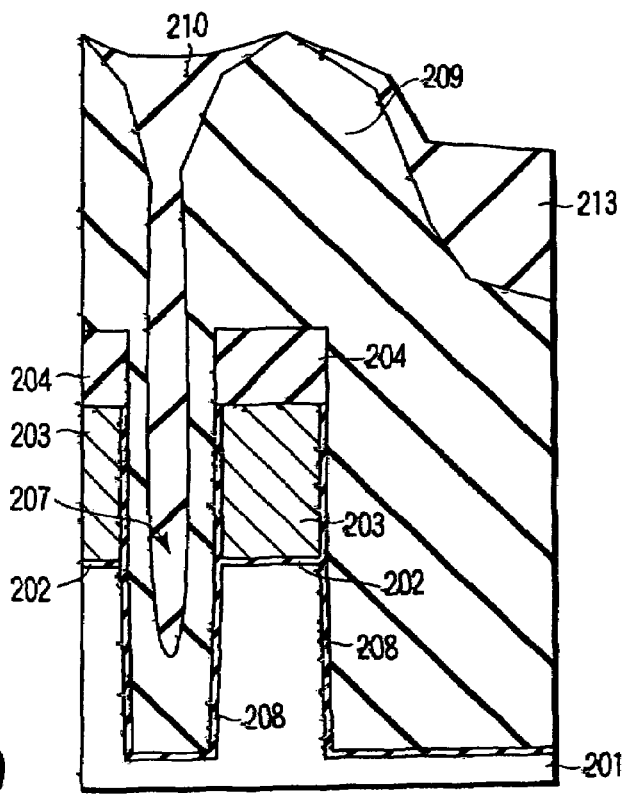
FIG. 19 is a sectional view continued from FIG. 18 and illustrating the method for manufacturing a semiconductor device in accordance with the second embodiment.

In a process of forming an isolation trench (second embodiment), the gate bird's beak is more problematic after a gate of a transistor has been formed as shown in FIG. 18.

The lower limit on the pressure for the second oxidation treatment is set at least 20 KPa for the same reason as that in the case of the first oxidation treatment. The second oxidation treatment is executed at a pressure equal to or lower than that for the first oxidation treatment. This suppresses the oxidation of an active area such as a gate bird's beak.

Figure 29:
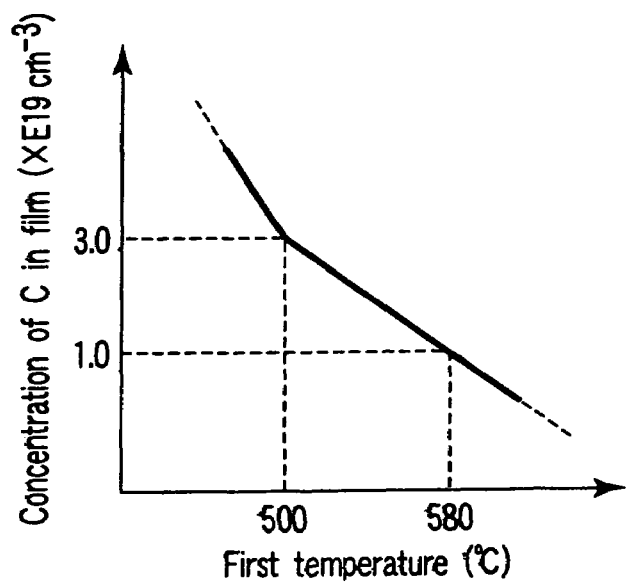
FIG. 29 is a diagram showing the relationship between temperature and the C concentration of an oxide film formed by oxidizing the polysilazane film in a water vapor atmosphere.

FIG. 29 is a diagram showing the relationship between temperature and the C concentration of the oxide film formed by oxidizing the polysilazane film in the water vapor atmosphere. FIG. 29 shows that a temperature of lower than 500° C. rapidly raises the C concentration, which increases above $3 \times 10^{19}$ cm$^{-3}$. Such a high C concentration may result in marked Vfb shifts as described above. The present embodiment accordingly sets the temperature for the second oxidation treatment at least 500° C.

Figure 30:
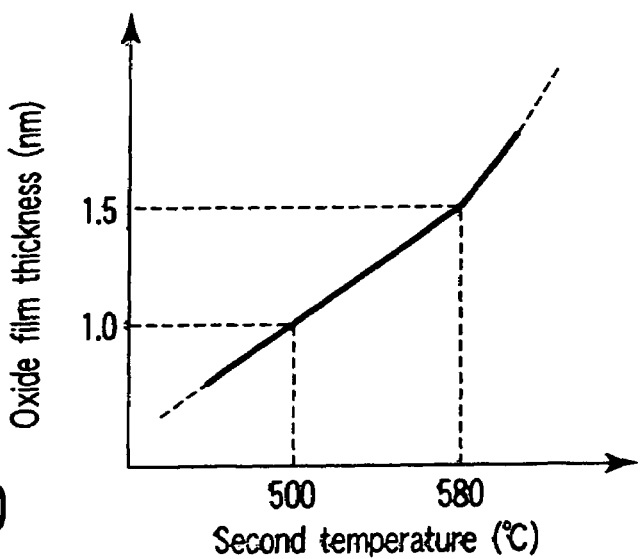
FIG. 30 is a diagram showing the relationship between temperature and the oxidized film thickness of the oxide film formed by oxidizing the bare silicon wafer in the water vapor atmosphere.

FIG. 30 is a diagram showing the relationship between temperature and the thickness of the oxide film on the bare silicon wafer formed by oxidizing the bare silicon wafer in the water vapor atmosphere. FIG. 30 shows that a temperature of higher than 580° C. rapidly increases the oxide film thickness. A rapid increase in oxide film thickness may result in the formation of a gate bird's beak as described above. The present embodiment accordingly sets the temperature for the second oxidation treatment at most 580° C. The second oxidation treatment is executed at a higher temperature than the first oxidation treatment. This sufficiently oxidizes and densifies the polysilazane film 108.

FIGS. 26 to 30 also show that the increase in oxide film thickness can be reduced to at most 1.5 nm by controlling the pressure for the first oxidation treatment and the temperature for the second oxidation treatment. The present inventors' studies show that the degradation of the electrical characteristics such as Vfb shifts can be suppressed by reducing the increase in oxide film thickness to at most 1.5 nm. That is, the present inventors have found that reducing the increase in oxide film thickness to at most 1.5 nm can prevent the peripheral structure of the polysilazane film 108 such as an active area from being affected.

[FIG. 8]

The first and second oxidation treatments remove impurities (carbon and hydrocarbon) from the polysilazane film 108. These treatments also convert some of the Si—N bonds in the polysilazane film 108 into Si—O bonds to convert the polysilazane film 108 into a silicon oxide film 111. This reaction typically progresses as shown below.

$$SiH_2NH + 2O \rightarrow SiO_2 + NH_3$$

An oxide film in accordance with the embodiment obtained by executing the first and second oxidation treatment on a bare silicon wafer was compared with an oxide film in a comparative example obtained by executing an oxidation treatment (heating treatment in a water vapor atmosphere at 500° C. and 40 KPa for 15 minutes) on a bare silicon wafer. The comparison is shown below.

TABLE 1

| | Oxidation thickness | Concentration of C in film |
|---|---|---|
| Oxidation treatment of embodiment | 1.45 nm | 1E19/cm$^3$ |
| Oxidation treatment in comparative example | 1.42 nm | 8E19/cm$^3$ |

The comparison of the oxide film of the embodiment with the oxide film in the comparative example indicates the thickness of the oxide film on the bare silicon wafer is almost equal between the embodiment and the comparative example; the oxide film thickness is indicative of the amount of oxidation in an oxidation treatment. However, the C concentration of the oxide film of the embodiment is one-eighth of that of the oxide film in the comparative example; the present embodiment drastically reduces the C concentration. The present embodiment thus enables the formation of a silicon oxide film serving as a high-quality isolation insulating film.

The amount of oxidation of the polysilazane film needs to be increased in order to reduce the concentration of impurities in the silicon oxide film by the oxidation treatment in the comparative example. However, an increase in the amount of oxidation of the polysilazane film may cause the oxidation of an insulating film such as the silicon oxide film in the active area or a polysilicon film used as a gate electrode. The oxidation of the film in the active area may degrade the electrical characteristics or reliability of the transistor.

The oxidation of the film in the active area may be suppressed by reducing the amount of oxidation of the polysilazane film. However, a reduction in the amount of oxidation of the polysilazane film may prevent a sufficient reduction in the amount of impurities such as carbon which remain in the polysilazane film. The impurities remaining in the polysilazane film serve as fixed charges. Consequently, the electrical characteristics of the transistor may be similarly degraded even by the method of reducing the amount of oxidation of the polysilazane film in order to suppress the oxidation of the film in the active area.

Subsequently, high temperature annealing is executed to further increase the density of the silicon oxide film 111. Typical conditions are a dry oxygen atmosphere, a temperature of 900° C., and a duration of 30 minutes.

[FIG. 9]

The silicon nitride film 103 is used as a stopper to polish the silicon oxide film 111 by the CMP process, thus flattening its surface. The silicon oxide film 111 has been sufficiently densified and is thus prevented from being degraded during the CMP process.

The above operation is followed by well-known steps of removing the silicon nitride film 103 by a wet process using a hot phosphoric acid and forming elements such as transistors. These steps result in a NAND type flash memory shown in FIG. 10. In FIG. 10, reference numerals 112, 113, and 114 denote a floating gate electrode, an inter-plate dielectric film, and a control gate electrode. Reference numerals 115 and 116 denote a silicide layer and an interlayer dielectric film.

Second Embodiment

FIGS. 11 to 20 are sectional views illustrating a method for manufacturing a semiconductor device in accordance with a second embodiment. FIGS. 11 to 20 are sectional views of a transistor taken across the channel width.

In the present embodiment, description will be given of a process of forming an isolation area after the formation of a gate (gate oxide film and floating gate electrode) of a transistor (STI process). The STI process in accordance with the present embodiment involves a step of filling an HDP-CVD silicon oxide film and a polysilazane film into an isolation trench and a step of executing a first and second oxidation treatments on a polysilazane film in a water vapor to convert the polysilazane film into a silicon oxide film.

[FIG. 11]

A gate oxide film 202, a polysilicon film 203, a silicon nitride film 204, a CVD silicon oxide film 205, and a resist pattern 206 are sequentially formed on a silicon substrate 201. The gate oxide film 202 is a thermal oxide film. The polysilicon film 203 is machined into a gate electrode. The silicon nitride film 204 is used as a polishing stopper during a CMP process.

[FIG. 12]

The resist pattern 206 is used as a mask to etch the CVD silicon oxide film 205 by the RIE (Reactive Ion Etching) process. The etched CVD silicon oxide film 205 is used as a hard mask.

[FIG. 13]

The resist pattern 206 is removed by an asher process and a wet process using a mixture of sulfuric acid and hydrogen peroxide. The CVD silicon oxide film 205 is used as a mask to sequentially etch the silicon nitride film 204, polysilicon film 203, gate oxide film 202, and silicon substrate 201 by the RIE process. A trench 207 is thus formed in a surface of the silicon substrate 201. The trench 207 has a depth of, for example, 200 nm.

[FIG. 14]

Fluoro vapor is used to selectively remove the CVD silicon oxide film 205. A thermal oxide film 208 is formed on an inner surface of the trench 207 by thermal oxidation. The thermal oxide film 208 has a thickness of, for example, 4 nm. The above steps result in an isolation trench including the trench 207 and the thermal oxide film 208.

[FIG. 15]

An HDP-CVD silicon oxide film 209 is formed all over the surface of the substrate. A wide isolation trench (trench 207') is filled with the HDP-CVD silicon oxide film 209. However, a narrow isolation trench (trench 207) is not completely filled with the HDP-CVD silicon oxide film 209. A slit-like gap remains in the narrow isolation trench. The slit-like gap has an aspect ratio of at least 10. It is thus difficult to fill the narrow isolation trench only with the HDP-CVD silicon oxide film 209.

[FIG. 16]

The spin coating method is used to form a polysilazane film 210 all over the surface of the substrate. A detailed description will be given of a method of forming a polysilazane film 210.

A perhydrosilazane polymer [(SiH$_2$ NH)n] is dispersed in a solvent of xylene, dibutylether, or the like to generate a perhydrosilazane polymer solution.

The spin coating method is used to coat the perhydrosilazane polymer solution on the silicon substrate 201 to form a coating film containing the perhydrosilazane polymer solution. Since the coating film is formed by coating the perhydrosilazane polymer solution, it is filled into the isolation trench of a high aspect ratio without forming any voids (unfilled parts) or seams (unfilled parts like joints).

The conditions for the formation of a coating film by the spin coating method are, for example, as follows: the speed at which the silicon substrate 201 is spun: 4,000 rpm, spin time: 30 seconds, the amount of perhydrosilazane polymer solution dropped: 8 cc, and target coating film thickness: 500 nm.

After the formation of the coating film, the silicon substrate 201 is heated to 180° C. using a hot plate. Subsequently, the silicon substrate 201 is baked in an inert gas atmosphere for three minutes. This causes the solvent in the perhydrosilazane polymer solution to be volatilized to convert the coating film into a polysilazane film 210. In this stage, the polysilazane film 108 contains about several to over 10 percents of carbon or hydrocarbon resulting from the solvent, as impurities.

Then, the silicon substrate 201 is introduced into the diffusion furnace at a temperature of about 200° C. The temperature in the diffusion furnace is increased to a predetermined temperature (220 to 280° C.). Once the temperature in the diffusion furnace reaches the predetermined value, the diffusion furnace stands by for, for example, at least five minutes in order to stabilize the temperature. This improves the uniformity of the temperature in the plane of a wafer and within a batch.

[FIG. 17]

Water vapor is introduced into the diffusion furnace. In a water vapor atmosphere 211 that meets predetermined conditions, a first oxidation treatment is executed on the polysilazane film 210. The pressure (partial pressure) of the water vapor in the water vapor atmosphere 211 is 20 to 40 KPa. The water vapor atmosphere 211 is at a temperature of 220 to 280° C. The treatment time is, for example, about one hour. That is, the first oxidation treatment of the present embodiment is similar to that of the first embodiment in the ranges of the pressure and temperature for the oxidation treatment and in the reason for the use of these ranges.

[FIG. 18]

After the oxidation treatment (first oxidation treatment) in the water vapor atmosphere 211, the temperature in the diffusion furnace is further increased. A second oxidation treatment is then executed on the polysilazane film 210 in a water vapor atmosphere 212 that meets predetermined conditions. The pressure (partial pressure) of the water vapor in the water vapor atmosphere 212 is equal to or lower than that for the first oxidation treatment and is 20 to 40 KPa. The water vapor atmosphere 212 is at a temperature of 500 to 580° C. The treatment time is, for example, about 10 minutes. The second oxidation treatment is executed at a pressure equal to or lower than that for the first oxidation treatment and at a higher temperature than the first oxidation treatment. That is, the second oxidation treatment of the present embodiment is similar to that of the first embodiment in the ranges of the pressure and temperature for the oxidation treatment and in the reason for the use of these ranges.

Figure 28:
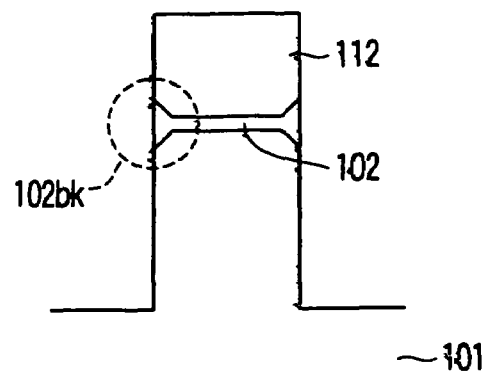
FIG. 28 is a sectional view showing a gate bird's beak obtained when a gate is formed earlier.

If the conventional process is used to form an isolation trench after the formation of a gate of a transistor, a gate bird's beak 102bk is formed in parts of the silicon areas 101 and 112 which are located over and under the ends of the gate oxide film 102 as shown in FIG. 28. However, the formation of the gate bird's peak 102bk is suppressed by setting the upper limit on the pressure for the oxidation treatment at most 40 KPa as in the case of the present embodiment. This contributes to reducing the size of elements. During an STI process, the thermal degradation of the gate oxide film 102 caused by thermal steps is also suppressed.

The present embodiment executes the first and second oxidation treatments in the same diffusion furnace. This reduces the treatment time to improve productivity. The present embodiment further uses a batch type treating apparatus to execute the first and second oxidation treatments. This increases the throughput per unit time.

[FIG. 19]

The first and second oxidation treatments remove impurities (carbon and hydrocarbon) from the polysilazane film 210. These treatments also convert some of the Si—N bonds in the polysilazane film 210 into Si—O bonds to convert the polysilazane film 210 into a silicon oxide film 213.

Subsequently, hot annealing is executed to further increase the density of the silicon oxide film 213. Typical conditions are a dry oxygen atmosphere, a temperature of 900° C., and a duration of 30 minutes. After the annealing, the concentration of nitrogen in the silicon oxide film 213 is 2%.

[FIG. 20]

The silicon nitride film 204 is used as a stopper to polish the silicon oxide film 111 by the CMP process, thus flattening its surface. The silicon oxide film 213 has been sufficiently densified and is thus prevented from being degraded during the CMP process.

Figure 20:
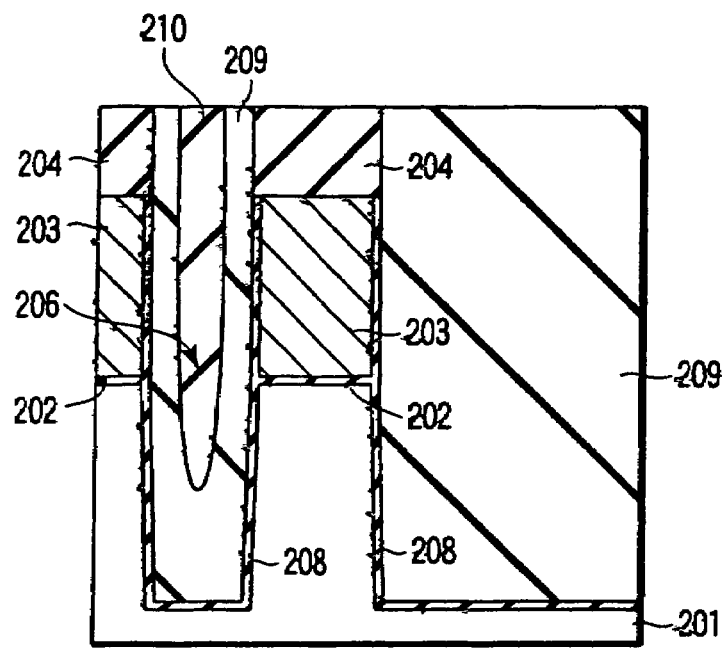
FIG. 20 is a sectional view continued from FIG. 19 and illustrating the method for manufacturing a semiconductor device in accordance with the second embodiment.
Figure 21:
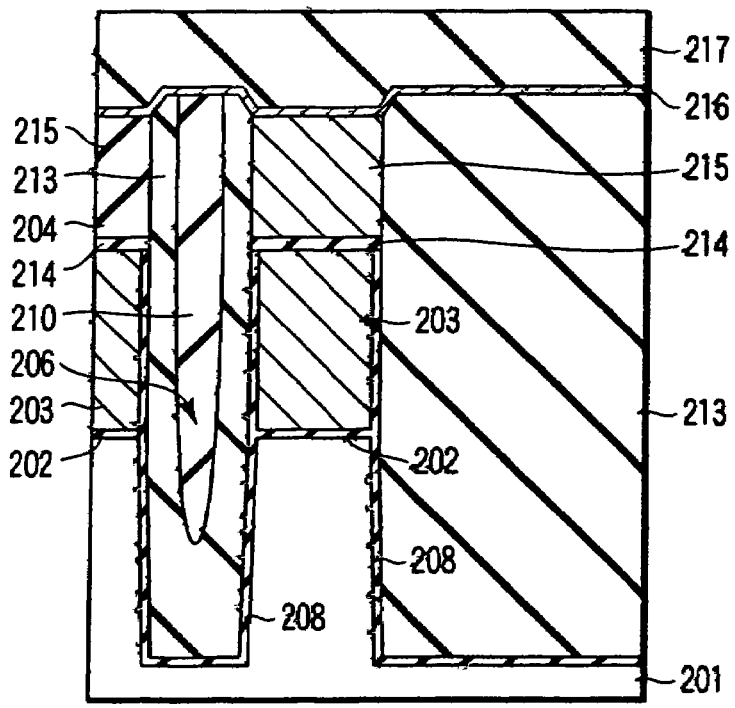
FIG. 21 is a sectional view showing a semiconductor device in accordance with the second embodiment.

The above operation is followed by well-known steps of removing the silicon nitride film 204 by a wet process using a hot phosphoric acid and forming elements such as transistors. These steps result in a flash memory shown in FIG. 21. In FIG. 20, reference numerals 214, 215, 216, and 217 denote an inter-plate dielectricg film, a control gate electrode, a silicide layer, and an interlayer dielectric film.

Third Embodiment

FIGS. 31 to 34 show a method for manufacturing a memory cell transistor for a flash memory according to a third embodiment. In the present embodiment, after forming a polysilicon film to be processed into a floating gate electrode on a semiconductor substrate via a gate dielectric film, an isolation trench is formed. Then, after burying a HDP-CVD silicon oxide in the isolation trench by high-density plasma CVD method, further a silicon-rich oxide film having a higher silicon composition ratio than a silicon oxide ($SiO_2$) film is further buried in the isolation trench.

Figure 31:
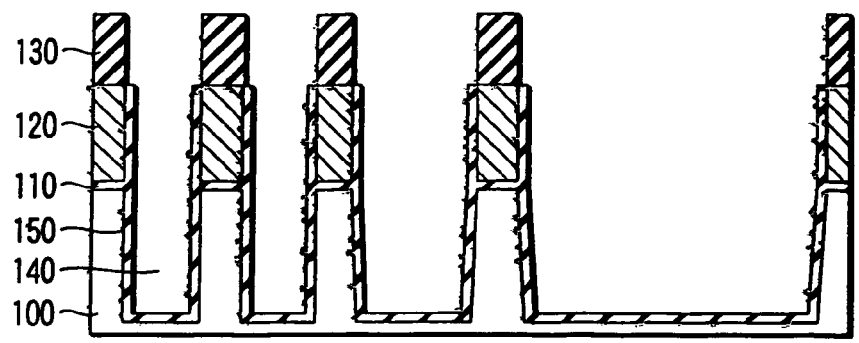
FIG. 31 is a vertical sectional view showing sectional structure of an element by a step of a method for manufacturing a semiconductor device according to a third embodiment.

As shown in FIG. 31, a silicon oxynitride (SiON) film 110 to be processed into a gate dielectric film is formed on a semiconductor substrate 100 to a thickness of about 8 nm. Thereafter, polysilicon film 120 doped with phosphor (P) is formed to a thickness of about 120 nm by CVD method, then, a silicon nitride (SiN) film 130 is formed to a thickness of about 100 nm to be a polishing stopper for polishing by CMP method performed later.

A silicon oxide ($SiO_2$) film (not shown) is formed on an entire surface by CVD method. A photo resist (not shown) is applied on this silicon oxide film, exposure and development are then carried out to form a resist mask (not shown).

This resist mask is used as a mask to pattern the silicon oxide film by RIE to form a hard mask. Thereafter, the resist mask is removed using an asher and etching with a mixture of sulfuric acid and hydrogen peroxide.

The hard mask is used as a mask to pattern the silicon nitride film 130, polysilicon film 120, and silicon thermal oxynitrided film 110 sequentially by RIE. Moreover, the hard mask is used as a mask to etch the semiconductor substrate 100 to form an isolation trench 140 with a thickness of about 220 nm from a surface of the semiconductor substrate 100.

After removing the hard mask by hydrofluoric vapor, a silicon thermal oxidized ($SiO_2$) film 150 of about 3 nm thickness is formed on an internal surface of the isolation trench 140 by thermal oxidation method.

Figure 32:
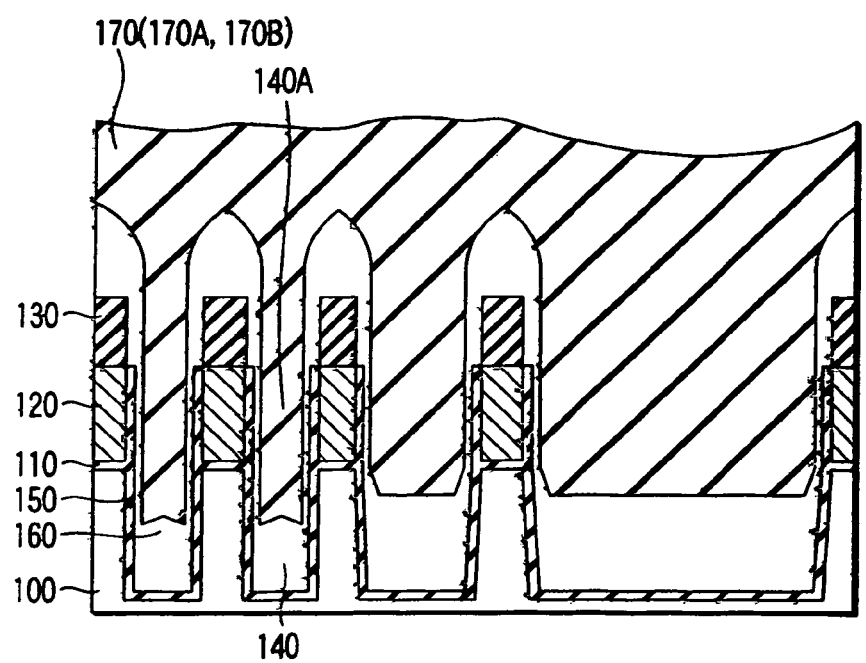
FIG. 32 is a vertical sectional view showing the sectional structure of the element by a step of the method for manufacturing the semiconductor device.

As shown in FIG. 32, an HDP-CVD silicon oxide ($SiO_2$) film 160 to be processed into an isolation insulating film is formed on the silicon thermal oxidation film 150 and silicon nitride film 130 to a thickness of about 100 nm by the high-density plasma CVD method so as to fill the vicinity of lower portion of the isolation trench 140. In this case, a void 140A is formed in the vicinity of upper portion of the isolation trench 140.

Subsequently, a silicon-rich oxide film 170 to be processed into an isolation insulating film is formed on the HDP-CVD silicon oxide film 160 so as to fill the void 140A, thereby, the isolation trench 140 is completely filled with the HDP-CVD silicon oxide film 160 and silicon-rich oxide film 170.

Hereinafter, a specific method for forming the silicon-rich oxide film 170 is explained. First, a perhydrosilazane polymer (($SiH_2NH)_n$) of average molecular weight 2000 to 6000 is dispersed in a solvent of for example, xylene ($C_6H_4(CH_3)_2$) or dibutylether (($C_4H_9)_2O$) to generate a perhydrosilazane polymer solution.

A coating film 170A is formed by coating a surface of the HDP-CVD silicon oxide film 160 with the perhydrosilazane polymer solution while rotating the semiconductor substrate 100 by spin coating method so as to fill the void 140A formed in the HDP-CVD silicon oxide film 160.

Thus coating the perhydrosilazane polymer solution which is a liquid, a void (unfilled portion) or seam (seam-like unfilled portion) is not formed inside of the isolation trench 140 even if an aspect of the isolation trench 140 is high and the isolation trench 140 has an overhung shape (opening is narrower than the bottom surface)

In this case, conditions for the spin coating method are, for example, rotation rate of the semiconductor substrate 100 is 1200 rpm, rotation time is 30 seconds, droplet amount of perhydrosilazane polymer solution is 2 cc, and target film thickness of the coating film 170A is about 450 nm.

Then, after placing the semiconductor substrate 100 on which the coating film 170A is formed on a hot plate, a thermal treatment of baking (heating) is performed to the coating film 170A in an inert gas atmosphere of 150° C. for three minutes.

This gives volatilization of the solvent such as xylene ($C_6H_4(CH_3)_2$) or dibutylether (($C_4H_9)_{20}$) existing in the perhydrosilazane polymer, and formation of polysilazane film 170B. In this case, carbon (C) or hydrocarbon included in the solvent remains as impurity of several percents to several tens percents of carbon (C) or hydrocarbon remains in the polysilazane film 170B Accordingly, the polysilazane film 170B is in a similar condition as a low density silicon oxide film including residual solvent.

Subsequently, a silicon-rich oxide film 170 is formed by performing a predetermined thermal treatment to the polysilazane film 170B. That is, the thermal treatment is performed to the polysilazane film 170B in a reduced pressure water vapor atmosphere at 200 to 650° C. in a condition that oxidation amount of silicon (semiconductor substrate 100) is to be about 0.7 to 1.6 nm.

Figure 35:
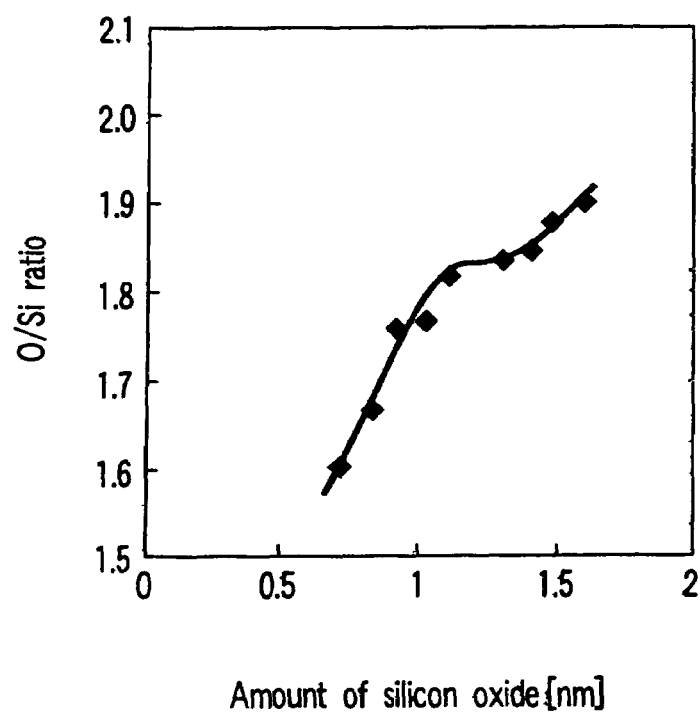
FIG. 35 is a diagram illustrating relationship between amount of silicon oxide and ratio of oxygen to silicon in a film.

In this case, as shown in FIG. 35, the ratio of oxygen (O) to silicon (Si) in the polysilazane film 170B varies from about 1.6 to 1.9. That is, the ratio of oxygen (O) to silicon (Si) in the polysilazane 170B is lower than the ratio of 2 in the silicon oxide ($SiO_2$) film and has a higher silicon composition ratio than the silicon oxide ($SiO_2$) film.

Figure 36:
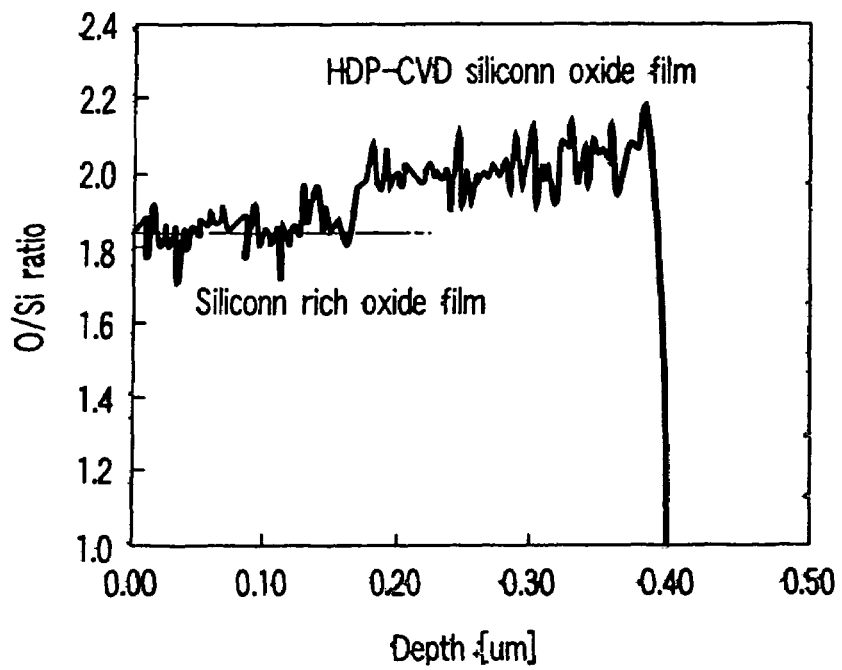
FIG. 36 is a diagram illustrating relationship between substrate depth and ratio of oxygen to silicon in a film.

Next, in an inert gas atmosphere at 800 to 1,000° C., a thermal treatment (annealing) is performed to the polysilazane film 170B, thereby, a dense silicon-rich oxide film 170 is formed. Consequently, as shown in FIG. 36, the vicinity of lower portion of the isolation trench 140 is filled with the HDP-CVD silicon oxide ($SiO_2$) film 160 in which the ratio of oxygen to silicon is about 2, and the vicinity of upper portion of the isolation trench 140 is filled with the silicon-rich oxide film 170 in which the ratio of oxygen to silicon is 1.85.

Figure 33:
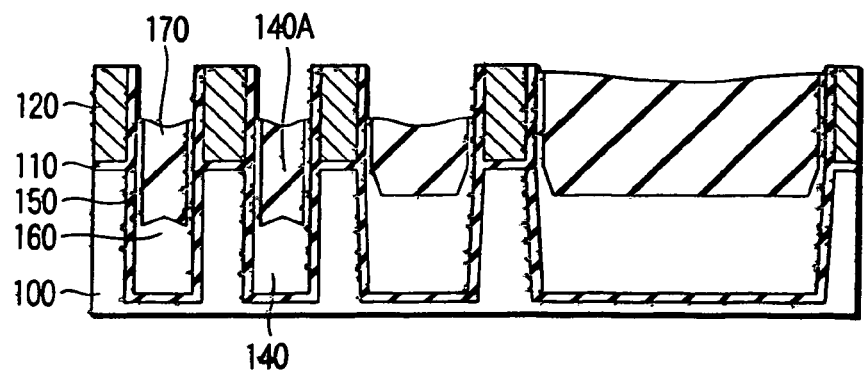
FIG. 33 is a vertical sectional view showing the sectional structure of the element by a step of the method for manufacturing the semiconductor device.

As shown in FIG. 33, the HDP-CVD silicon oxide film 160 and silicon-rich oxide film 170 are polished by CMP method using the silicon nitride film 130 as a stopper to flatten their surfaces, thereby, the silicon nitride film 130 is exposed, and the HDP-CVD silicon oxide film 160 and silicon-rich oxide film 170 are remained only inside the isolation trench 140.

The HDP-CVD silicon oxide film 160 and silicon-rich oxide film 170 remaining in the isolation trench 140 are etched back about 120 nm by RIE, thereby, an isolation insulating film is formed. Thereafter, the silicon nitride film 130 is removed using hot phosphoric acid.

Figure 37:
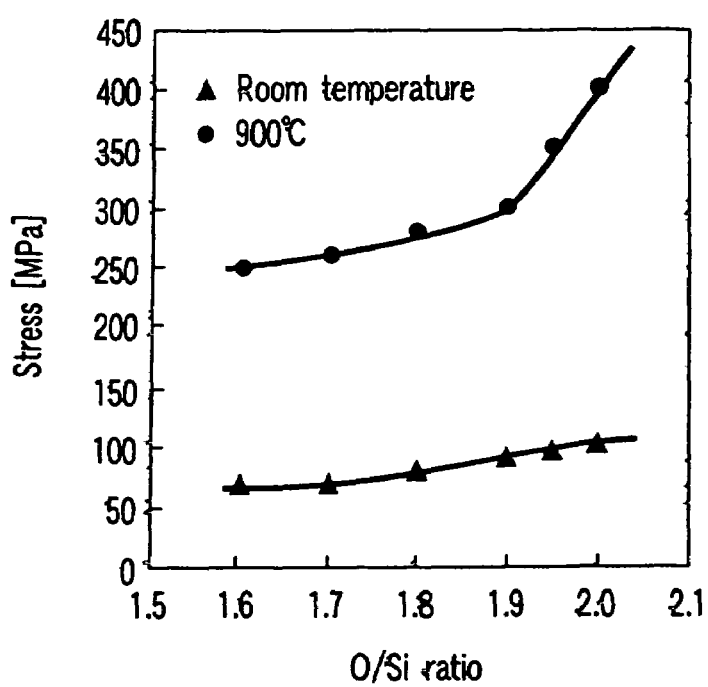
FIG. 37 is a diagram illustrating relationship between ratio of oxygen to silicon in a film and stress.

Incidentally, as shown in FIG. 37, the stress of the polysilazane film 170B is generally approximately constant regardless of the ratio of oxygen to silicon if the surrounding temperature is equal to the room temperature, however, at 900° C., the stress varies by 100 MPa or more depending on the ratio of oxygen to silicon.

Consequently, s shown in FIG. 38, when the HDP-CVD silicon oxide film 160 and silicon-rich oxide film 170 remaining inside the isolation trench 140 is etched back after forming the silicon-rich oxide film 170 by performing thermal treatment in an inert gas atmosphere at 800 to 1,000° C., defect generation density that concave shape defect occurs in the vicinity of an upper corner of the isolation insulating film comprising the HDP-CVD silicon oxide film 160 and silicon-rich oxide film 170 varies significantly depending on the ratio of oxygen to silicon in the polysilazane film 170B. As shown in FIG. 38, the defect generation density decreases sharply when the ratio of oxygen to silicon in the polysilazane film 170B is 1.9 or lower and becomes approximately zero when the ratio is 1.8 or lower.

Figure 34:
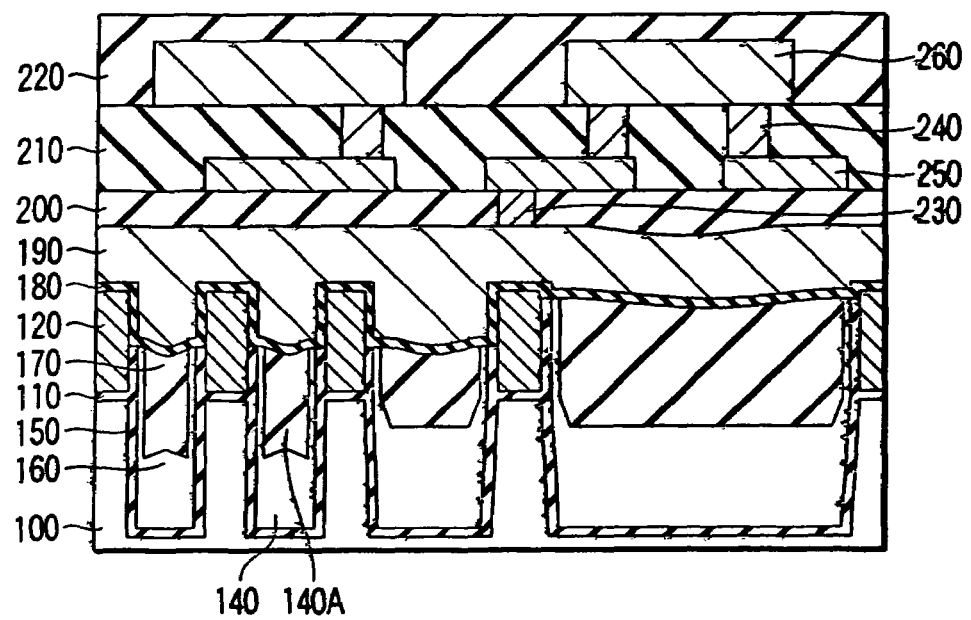
FIG. 34 is a vertical sectional view showing the sectional structure of the element by a step of the method for manufacturing the semiconductor device.

As shown in FIG. 34, after forming an ONO film 180 to be processed into an inter-plate dielectric film, a polysilicon film 190 doped with phosphor (P) is formed to be processed into a control gate electrode. Then, the polysilicon film 190, ONO film 180, and polysilicon film 120 are sequentially patterned by lithography and RIE, thereby, the floating gate electrode formed of the polysilicon film 120 and the control gate film formed of the polysilicon film 190 are formed.

Thereafter, a source region and a drain region not shown, interlayer dielectric films 200, 210, and 220, contact plugs 230 and 240, and wires 250 and 260 are sequentially formed, thereby, the flash memory is manufactured.

As shown in FIG. 34, the memory cell transistor manufactured by the above method has the isolation trench 140 which is selectively formed on the surface of the semiconductor substrate 100. The HDP-CVD silicon oxide film 160 is formed in the isolation trench 140 so as to fill the vicinity of lower portion of the isolation trench 140 via the silicon thermal oxidization film 150 and to cover the internal surface of vicinity of the upper portion of the isolation trench 140. Further, the silicon-rich oxide film 170 is formed to fill the void 140A in the vicinity of upper portion of the isolation trench 140 formed by the HDP-CDV silicon oxide film 160.

On the other hand, the floating gate electrode comprising the polysilicon film 120 is formed on the element formation region of the semiconductor substrate 100 via the gate dielectric film comprising the silicon oxynitride film 110, the control gate electrode comprising the polysilicon film 190 is formed on the polysilicon film 120, HDP-CVD silicon oxide film 160, and silicon-rich oxide film 170 via the ONO film 180.

Thus, according to the present embodiment, by filling the isolation trench 140 with the silicon-rich oxide film 170, which exhibits a coefficient of thermal expansion only slightly different from that of the semiconductor substrate 100 (silicon substrate), the stress caused by the filling material filled into the isolation trench 140 is suppressed, thereby, the variation of threshold voltage of the memory cell transistor is suppressed.

Here, FIG. 39 shows the threshold voltage of the memory cell transistor formed according to the present embodiment and the threshold voltage of a memory cell transistor formed according to a comparative example in which for example, a polysilazane film is oxidized in a water vapor atmosphere at 400° C. for 60 minutes to form a silicon oxide ($SiO_2$) film. As shown in FIG. 39, the present embodiment improves the threshold of the memory cell transistor by 0.07 V and reduces the variation in threshold voltage.

Further, according to the present embodiment, when the HDP-CVD silicon oxide film 160 and silicon-rich oxide film 170 remaining inside the isolation trench 140 is etched back, the peeling of the upper corner of the isolation insulating film forming of the HDP-CVD silicon oxide film 160 and silicon-rich oxide film 170 is prevented, and then the generation of the divot shape defect in the vicinity of the upper corner is prevented.

Incidentally, as shown in FIG. 40, generally, the silicon-rich oxide film tends to occur hopping conductance and has characteristics of lower breakdown voltage than the silicon oxide ($SiO_2$) film. However, as in the present embodiment, if the HDP-CVD silicon oxide film 160 having high breakdown voltage is formed in the vicinity of the floating gate electrode comprising the polysilicon film 120 a given insulating characteristic is secured and then the breakdown voltage is improved.

Though, as shown in FIG. 40, the breakdown voltage of the silicon-rich oxide film lowers sharply when the ratio of oxygen to silicon in the silicon oxide film is lower than 1.8. Accordingly, for a flash memory to which the breakdown voltage is relatively important, the ratio of oxygen to silicon in the silicon-rich oxide film is desirably 1.8 or more.

Figure 41:
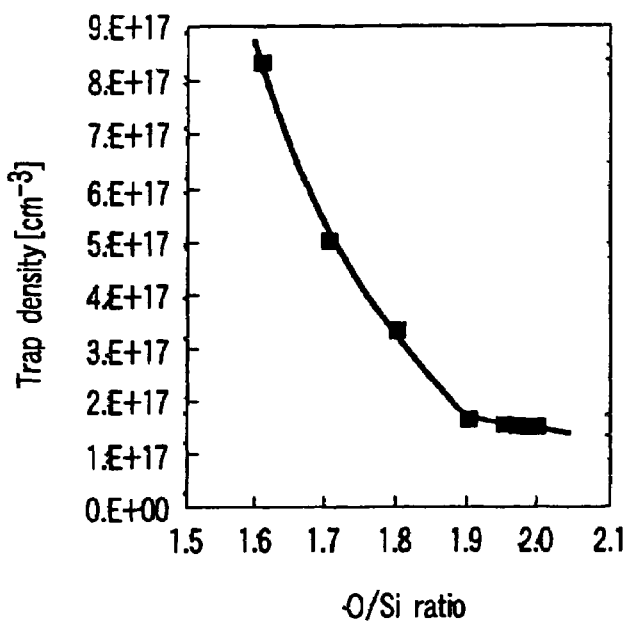
FIG. 41 is a diagram illustrating relationship between ratio of oxygen to silicon in a film and trap density.

Further, as shown in FIG. 41, generally, trap density of the silicon-rich oxide film increases as the ratio of oxygen to silicon in the film decreases, then problem that the silicon-rich oxide film tends to be charged occurs. This trap density is allowable if it is $5 \times 10^{17}$ cm$^{-3}$ or less, accordingly, the ratio of oxygen to silicon in the silicon-rich oxide film is desirably 1.7 or more.

Thus, the present embodiment can reduce variations in transistor characteristics and improve electrical characteristics.

The above third embodiment is an example and does not limit the present invention. For example, the silicon-rich oxide film 170 can be formed of an HSQ (Hydrogen Silises Quioxane (HSiO$_{3/2}$)$_n$) film or a condensed CVD film instead of polysilazane film 170B, in short, the silicon-rich oxide film may be formed of a film having flowability at the time of forming the film.

Fourth Embodiment

FIGS. 42 to 45 show a method for manufacturing a memory cell transistor for a flash memory according to a fourth embodiment. In the present embodiment, after forming a polysilicon film to be processed into a floating gate electrode on a semiconductor substrate via a gate dielectric film, an isolation trench is formed. Then, after forming a CVD silicon oxide (SiO$_2$) film having a uniform film thickness as a liner film in the isolation trench so as to cover an internal surface of the isolation trench, a silicon-rich oxide film having a higher silicon content than the silicon oxide (SiO$_2$) film and an HDP-CVD silicon oxide film are sequentially filled in the isolation trench. The step of the third embodiment shown in FIG. 31 is the same as that of the fourth embodiment, so that its description is abbreviated.

Figure 42:
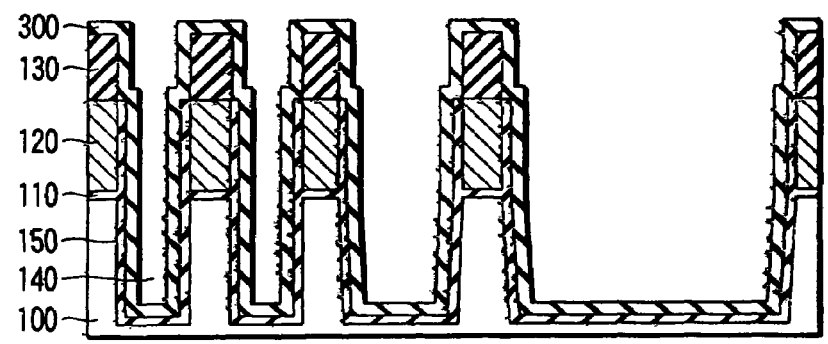
FIG. 42 is a cross sectional view showing the sectional structure of an element by a step of a method for manufacturing a semiconductor device according to a fourth embodiment.

As shown in FIG. 42, a CVD silicon oxide film 300 having a uniform thickness is formed on the silicon nitride film 130 and silicon thermal oxidization film 150 to a thickness of about 25 nm by LPCVD method so as to cover the internal surface of the isolation trench 140.

Figure 43:
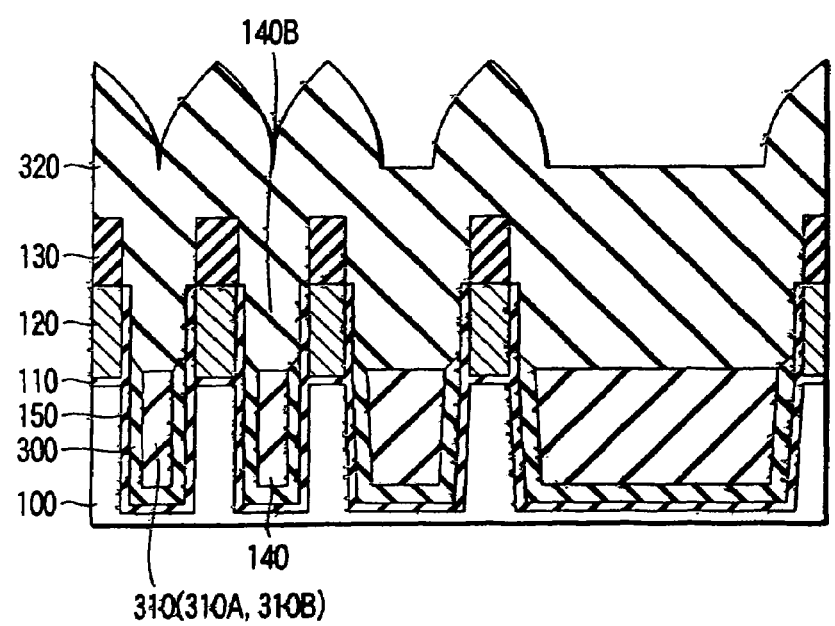
FIG. 43 is a cross sectional view showing the sectional structure of the element by a step of the method for manufacturing the semiconductor device.

As shown in FIG. 43, a silicon-rich oxide film 310 to be processed into an isolation insulating film is formed on the CVD silicon oxide film 300 so as to fill the isolation trench 140. A method for forming the silicon-rich oxide film 310 will be described below. However, the same portions as those of the third embodiment will not be described.

A coating film 310A is formed by coating a surface of the CVD silicon oxide film 300 with the perhydrosilazane polymer solution while rotating the semiconductor substrate 100 by spin coating method so as to fill the isolation trench 140.

In this case, conditions for the spin coating method are, for example, rotation rate of the semiconductor substrate 100 is 700 rpm, rotation time is 30 seconds, droplet amount of perhydrosilazane polymer solution is 2 cc, and target film thickness of the coating film 310A is about 700 nm.

Then, after placing the semiconductor substrate 100 on which the coating film 310A is formed on a hot plate, a thermal treatment of baking (heating) is performed to the coating film 310A in an inert gas atmosphere of 150° C. for three minutes.

This gives volatilization of the solvent such as xylene (C$_6$H$_4$(CH$_3$)$_2$) or dibutylether ((C$_4$H$_9$)$_2$O) existing in the perhydrosilazane polymer, and formation of polysilazane film 310B.

Subsequently, a silicon-rich oxide film 310 is formed by performing a predetermined thermal treatment to the polysilazane film 310B. That is, the thermal treatment is performed to the polysilazane film 310B in a reduced pressure water vapor atmosphere at 300° C. in a condition that oxidation amount of silicon (semiconductor substrate 100) is to be about 0.8 nm. In this case, the ratio of oxygen to silicon in the polysilazane 310B varies to about 1.75.

As shown in FIG. 43, the silicon-rich oxide film 310 is polished by CMP method using the silicon nitride film 130 as a stopper to flatten its surface, thereby, the silicon nitride film 130 is exposed, and the silicon-rich oxide film 310 is remained only inside the isolation trench 140.

The silicon-rich oxide film 310 remaining in the isolation trench 140 is etched back about 170 nm by wet etching or RIE, and at this time, the CVD silicon oxide film 300 is etched back. In this case, a groove 140B is formed in the vicinity of upper portion of the isolation trench 140.

Subsequently, a HDP-CVD silicon oxide film 320 is formed about 500 nm on the entire surface so as to fill groove 140B, thereby, the isolation trench 140 is completely filled with the CVD silicon oxide film 300, silicon-rich oxide film 310, and HDP-CVD silicon oxide film 320.

Figure 46:
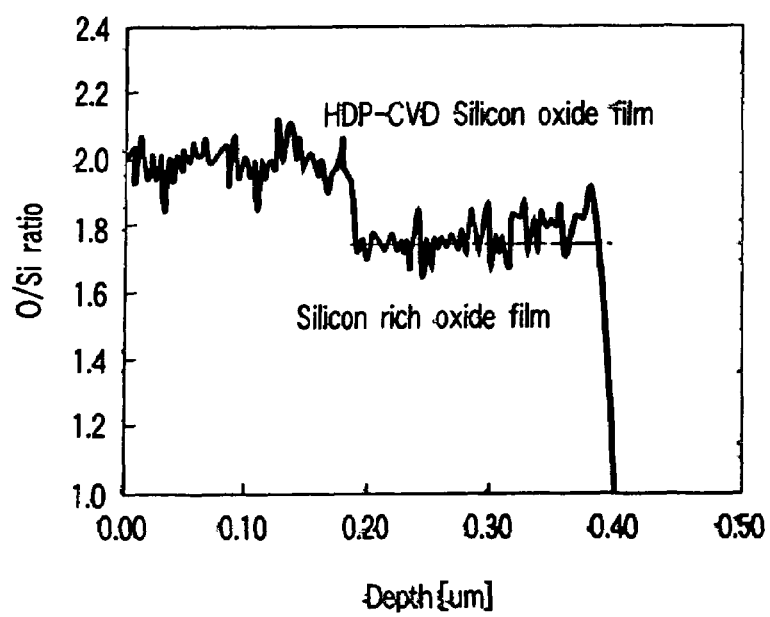
FIG. 46 is a diagram illustrating relationship between substrate depth and ratio of oxygen to silicon in a film.

In this case, as shown in FIG. 46, the vicinity of lower portion of the isolation trench 140 is filled with the silicon-rich oxide film 310 in which the ratio of oxygen to silicon is about 1.75, and the vicinity of upper portion of the isolation trench 140 is filled with the HDP-CVD silicon oxide (SiO$_2$) film 320 in which the ratio of oxygen to silicon is about 2.

Figure 44:
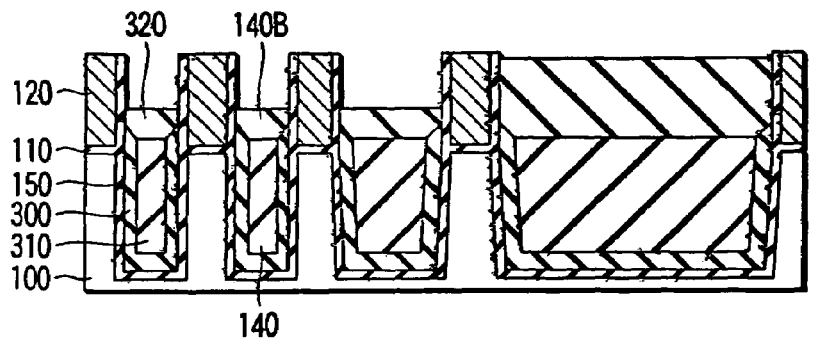
FIG. 44 is a cross sectional view showing the sectional structure of the element by a step of the method for manufacturing the semiconductor device.

As shown in FIG. 44, the HDP-CVD silicon oxide film 320 is polished by CMP method using the silicon nitride film 130 as a stopper to planarize its surface, thereby, the silicon nitride film 130 is exposed, and the HDP-CVD silicon oxide film 320 is remained only inside the isolation trench 140. Thereafter, the silicon nitride film 130 is removed using hot phosphoric acid.

Moreover, an isolation insulating film is formed by etching the HDP-CVD silicon oxide film 320 about 120 nm by RIE.

Figure 45:
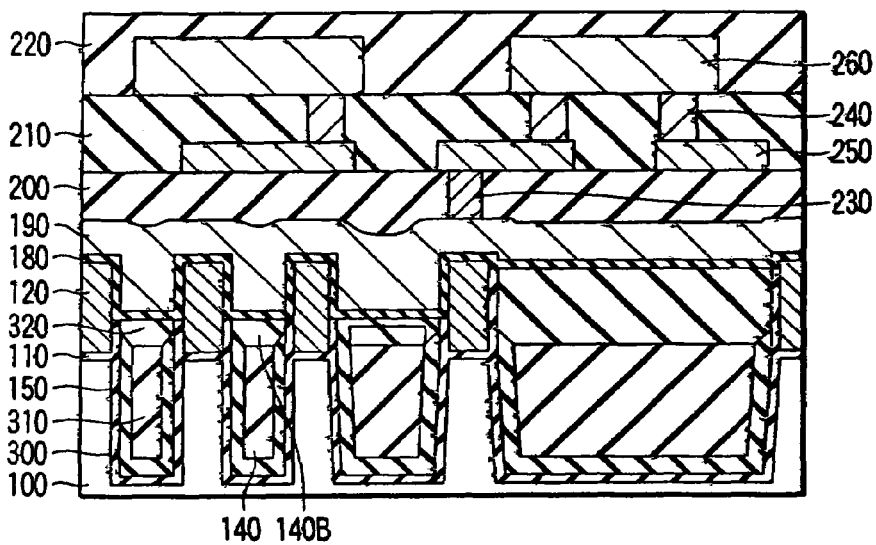
FIG. 45 is a cross sectional view showing the sectional structure of the element by a step of the method for manufacturing the semiconductor device.

As shown in FIG. 45, steps similar to those of the third embodiment are performed to manufacture the memory cell transistor for the flash memory.

As shown in FIG. 45, the memory cell transistor manufactured by the above method has the isolation trench 140 which is selectively formed on the surface of the semiconductor substrate 100. In the isolation trench 140, the CVD silicon oxide film 300 is formed so as to cover the vicinity of lower portion of the isolation trench 140 via the silicon thermal oxidization film 150 and the silicon-rich oxide film 310 is formed so as to file the vicinity of the lower portion of the isolation trench 140 covered with the CVD silicon oxide film 300.

Further, the HDP-CDV silicon oxide film 320 is formed so as to fill the groove 140B in the vicinity of upper portion of the isolation trench 140 formed by CVD silicon oxide film 300 and silicon-rich oxide film 310. The element formation region of the semiconductor substrate 100 is formed similarly to that in the third embodiment and will not be described.

Thus, according to the present embodiment, like the third embodiment, by filling the isolation trench 140 with the silicon-rich oxide film 310, which exhibits a thermal expansion coefficient only slightly different from that of the semiconductor substrate 100 (silicon substrate), the stress caused by the filling material filled into the isolation trench 140 is suppressed, thereby, the variation of threshold voltage of the memory cell transistor is suppressed.

FIG. 47 shows the threshold voltage of the memory cell transistor formed according to the present embodiment and the threshold voltage of a memory cell transistor formed according to a comparative example in which for example, a polysilazane film is oxidized in a water vapor atmosphere at 400° C. for 60 minutes to form a silicon oxide ($SiO_2$) film. As shown in FIG. 47, the present embodiment improves the threshold of the memory cell transistor by 0.03 V and reduces the variation in the threshold voltage.

Further, the silicon composition ratio of the silicon-rich oxide film 310 of the present embodiment is set higher than that of the silicon-rich oxide film of the third embodiment in order to the etch back is easily performed, it makes the lower breakdown voltage lower. However, as in the present embodiment, when the silicon-rich oxide film 310 is wrapped with the CVD silicon oxide film 300 having the uniform thickness and the HDP-CVD silicon oxide film 320 having high breakdown voltage is formed in the vicinity of the floating gate electrode comprising the polysilicon film 120, a given insulating characteristic is secured and then the breakdown voltage is improved.

Incidentally, by filling the vicinity of lower portion of the isolation trench 140 with the silicon-rich oxide film 310 and filling the vicinity of upper portion of the isolation trench 140 with the HDP-CVD silicon oxide film 320, it is possible to suppress retraction of the filling material and resultant concentration of electric field at the edge of the element formation region even if the upper portion of the filling material filled in the isolation trench 140 is exposed to wet etching again and again.

The present invention can thus reduce variation in transistor characteristics and improve the electrical characteristics.

The above fourth embodiment is an example and does not limit the present invention. For example, the silicon-rich oxide film 310 can be formed of the HSQ film or the condensed CVD film instead of polysilazane film 310B, in short, the silicon-rich oxide film may be formed of a film having flowability at the time of forming the film.

Here, as an example, a method for forming the silicon-rich oxide film from the HSQ film is explained. First, HSQ $((HSiO_{3/2})_n)$ with an average molecular weight of 4000 is dispersed into, for example, xylene or siloxane, and the resultant solution is applied by spin coating method, thereby, a coating film is formed.

In this case, conditions for the spin coating method are, for example, rotation rate of the semiconductor substrate 100 is 4000 rpm, rotation time is 30 seconds, droplet amount of HSQ solution is 2 cc, and target film thickness of the coating film is about 550 nm.

And, after placing the semiconductor substrate 100 on which the coating film is formed on a hot plate, a thermal treatment of baking (heating) is performed to the coating film in an inert gas atmosphere of 150 to 350° C. for one minute, thereby the solvent in the HSQ solution is volatilized.

Subsequently, a silicon-rich oxide film with 1.76 ratio of oxygen to silicon is formed by heating the coating film in a water vapor atmosphere at 250° C. for 30 minutes, further heating the coating film in a water vapor atmosphere at 350° C. for 30 minutes, and by oxidizing the coating film in a condition that oxidization amount of silicon is to be about 0.9 nm.

Fifth Embodiment

Figure 50:
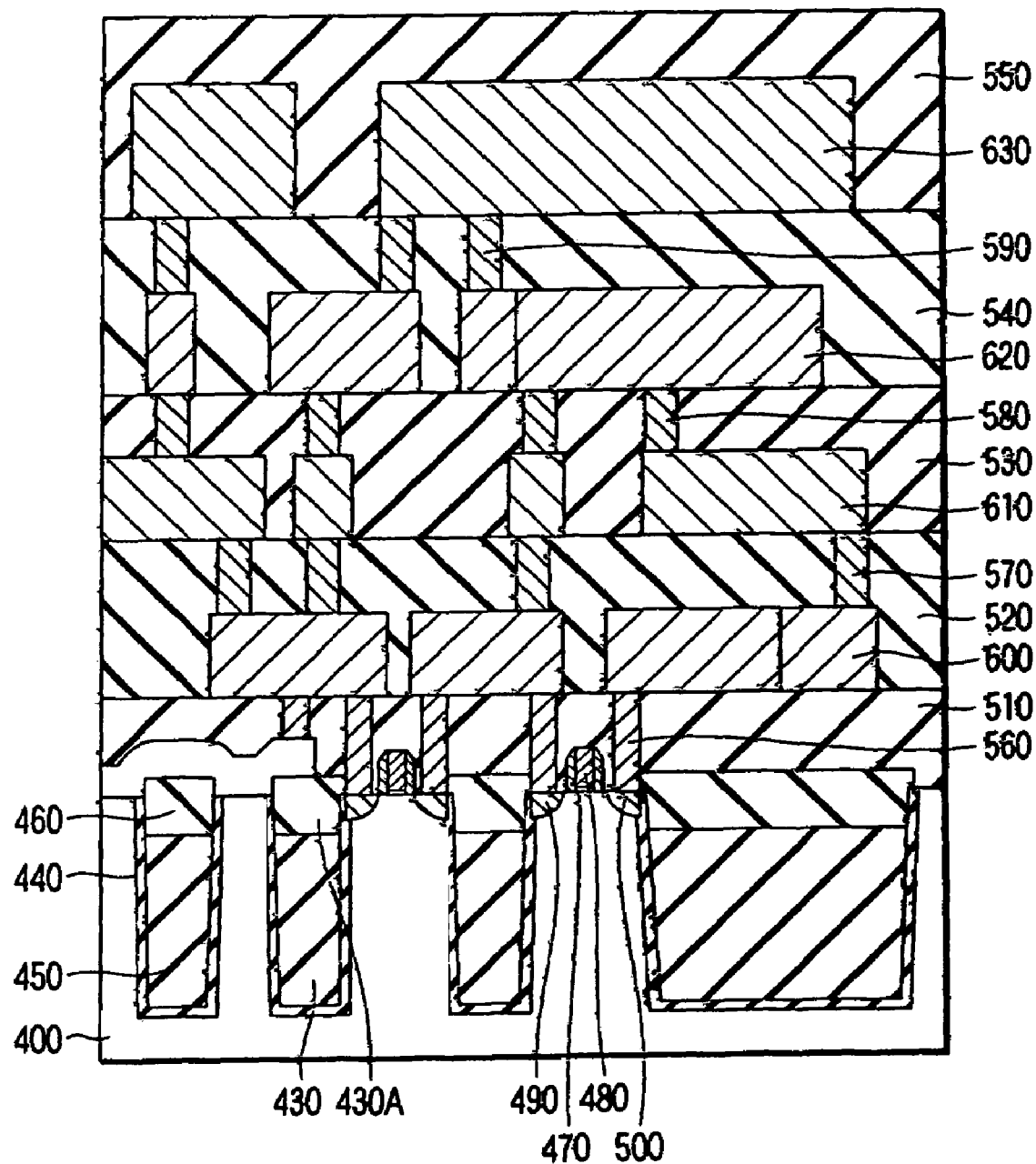
FIG. 50 is a cross sectional view showing the sectional structure of the element by a step of the method for manufacturing the semiconductor device.

FIGS. 48 to 50 show a method for manufacturing a transistor according to a fifth embodiment. In the present embodiment, after forming an isolation trench on a surface of a semiconductor substrate, the isolation trench is filled with a silicon-rich oxide film and an HDP-CVD silicon oxide film sequentially. The transistor according to the present embodiment is applied mainly to logic device.

As shown in FIG. 48, after forming a silicon oxide ($SiO_2$) film 410 about 2 nm on a semiconductor substrate 400, a silicon nitride (SiN) film 420 to be a stopper for polishing by CMP method is formed about 75 nm by CVD method. A resist mask (not shown) is formed by applying a photo resist (not shown) on this CVD silicon oxide film and by performing exposure and development.

This resist mask is used as a mask to pattern the silicon oxide film by RIE to form a hard mask. Thereafter, the resist mask is removed by an asher and etching with a mixture of sulfuric acid and hydrogen peroxide.

The hard mask is used as a mask to sequentially pattern the silicon nitride film 420 and silicon oxide film 410 by RIE. Further, the hard mask is used as a mask to etch the semiconductor substrate 400 to form an isolation trench 430 with a depth of about 250 nm from a surface of the semiconductor substrate 400.

After removing the hard mask by hydrofluoric vapor, the silicon nitride film 420 is etched in hot phosphoric acid by about 15 nm in the lateral direction of the figure. Then, a silicon thermal oxidization film 440 is formed 3 nm on an internal surface of the isolation trench 430 by thermal oxidation method.

As shown in FIG. 49, a silicon-rich oxide film 450 to be processed into an isolation insulating film is formed on the silicon thermal oxide film 440 and silicon nitride film 420 so as to fill this isolation trench 430. A specific description will be given below of a method for forming the silicon-rich oxide film 450.

First, the semiconductor substrate 400 is cooled to 0° C. in a vacuum chamber, silane and hydrogen peroxide are introduced into the vacuum chamber to form a chemical vapor condensation film 450A having high flowability on the silicon thermal oxide film 440 and silicon nitride film 420, thereby, the isolation trench 430 is filled with the condensed CVD film 450A.

Sequentially, a silicon-rich oxide film 450 is formed by performing a predetermined thermal treatment to the film chemical vapor condensation 450A. That is, the oxidation treatment is performed to the condensed CVD film 450A in a reduced pressure water vapor atmosphere at 250 to 650° C. in a condition that oxidation amount of the silicon (semiconductor substrate 400) is to be about 0.7 to 1.7 nm. Thereby, a silicon-rich oxide film 450 in which the ratio of oxygen to silicon is lower than 2 is formed.

In the present embodiment, the silicon-rich oxide film 450 with 1.81 ratio of oxygen to silicon is formed by performing the oxidation treatment in the reduced pressure water vapor atmosphere at 400° C. so that the oxidation amount of silicon is to be about 1.1 nm.

In this case, as shown in FIG. 51, the stress caused by the silicon-rich oxide film 450 can be reduced by setting the ratio of oxygen to silicon in the silicon-rich oxygen film 450 at 1.9 or lower.

Referring back to FIG. 49, the silicon-rich oxide film 450 is polished by CMP method using the silicon nitride film 420 as a stopper to flatten its surface, thereby, the silicon nitride film 420 is exposed, and the silicon-rich oxide film 450 is remained only inside the isolation trench 430.

The silicon-rich oxide film 450 remaining in the isolation trench 430 is etched back about 130 nm by wet etching or RIE. In this case, a void 430A is formed in the vicinity of upper portion of the isolation trench 430.

Subsequently, a HDP-CVD silicon oxide film 460 is formed about 500 nm on the entire surface so as to fill void 430A, thereby, the isolation trench 430 is completely filled with the silicon-rich oxide film 450 and HDP-CVD silicon oxide film 460.

In this case, as shown in FIG. 52, the vicinity of lower portion of the isolation trench 430 is filled with the silicon-rich oxide film 450 in which the ratio of oxygen to silicon is about 1.83, and the vicinity of upper portion of the isolation trench 430 is filled with the HDP-CVD silicon oxide film 460 in which the ratio of oxygen to silicon is about 2.

As shown in FIG. 50, the HDP-CVD silicon oxide film 460 is polished by CMP method using the silicon nitride film 420 as a stopper to flatten its surface, thereby, the silicon nitride film 420 is exposed, and the HDP-CVD silicon oxide film 460 is remained only inside the isolation trench 460. Thereafter, the silicon nitride film 42 is removed using hot phosphoric acid.

Further, an isolation insulating film is formed by etching the silicon oxide film 410 and HDP-CVD silicon oxide film 460 by RIE.

Next, a silicon thermal oxidization film 470 to be processed into a gate dielectric film and a polysilicon film 480 to be processed into a gate electrode are formed, there are patterned by lithography and RIE, thereafter, a source region 490 and a drain region 500 are formed, thereby, the transistor is formed. Thereafter, interlayer dielectric films 510 to 550, contact plugs 560 to 590, and wires 600 to 630 are sequentially formed, thereby, a multilayer wiring is formed.

As shown in FIG. 50, the memory cell transistor manufactured by the above method has the isolation trench 430 which is selectively formed on the surface of the semiconductor substrate 400. In this isolation trench 430, the silicon-rich oxide film 450 is formed so as to fill the vicinity of lower portion of the isolation trench 140 via the silicon thermal oxide film 150.

On the other hand, the gate electrode comprising the polysilicon film 480 is formed on the element formation region of the semiconductor substrate 400 via the gate dielectric film comprising the silicon oxynitride film 47, in addition, the source region 490 and drain region 500 are formed on the surface of the semiconductor substrate 400.

Thus, according to the present embodiment, like the third embodiment, by filling the isolation trench 430 with the silicon-rich oxide film 450, which exhibits a thermal expansion coefficient only slightly different from that of the semiconductor substrate 100 (silicon substrate), the stress caused by the filling material filled into the isolation trench 430 is suppressed, thereby, the variation of threshold voltage of the memory cell transistor is suppressed.

Here, FIG. 53 shows the threshold voltage of the memory cell transistor formed according to the present embodiment and the threshold voltage of a memory cell transistor formed according to a comparative example in which for example, a polysilazane film is oxidized in a water vapor atmosphere at 400° C. for 60 minutes to form a silicon oxide ($SiO_2$) film. As shown in FIG. 53, the present embodiment reduces the variation in threshold voltage to approximately half.

Further, the silicon composition ratio of the silicon-rich oxide film 450 of the present embodiment is set higher than that of the silicon-rich oxide film of the third embodiment in order to the etch back is easily performed, it makes the lower breakdown voltage lower. However, the transistor of the present embodiment is applied mainly to logic device, and in this case, a given insulating characteristic is secured and then the breakdown voltage is improved.

Incidentally, as is the case with the fourth embodiment, by filling the vicinity of lower portion of the isolation trench 430 with the silicon-rich oxide film 450 and filling the vicinity of upper portion of the isolation trench 430 with the HDP-CVD silicon oxide film 430, it is possible to suppress recession of the filling material and resultant concentration of electric field at the edge of the element formation region even if the upper portion of the filling material filled in the isolation trench 430 is exposed to wet etching again and again.

The present embodiment can thus reduce variations in transistor characteristics and improve the electrical characteristics.

The above fifth embodiment is illustrative and does not limit the present invention. For example, the silicon-rich oxide film 450 can be formed of polysilazane film or the HSQ film instead of the condensed CVD film 450A, in short, the silicon-rich oxide film may be formed of a film having flowability at the time of forming the film.

The present invention is not limited to the above first to fifth embodiments. For example, the first embodiment refers to the example of a single layer film in which the polysilazane film is filled into the isolation trench. However, a stacked film may be used which contains an HDP-CVD silicon oxide film and a polysilazane film. A stacked film containing an HTO film and a polysilazane film may also be used instead of the HDP-CVD silicon oxide film. That is to say, the above embodiments may be suitably implemented in combination.

In the above description of the embodiments, the present invention is applied to the polysilazane film used as an isolation insulating film. However, the present invention is also applicable to an insulation film for another application such as an interlayer insulating film.

For example, the polysilazane film in accordance with the embodiments may be used instead of the HDP-CVD silicon oxide film used as the interlayer dielectric film. Compared to the HDP-CVD silicon oxide film, the interlayer dielectric film serves to avoid plasma damage to the area in which the interlayer dielectric film is formed. This prevents changes in the nature of the film in the area in which the interlayer dielectric film is formed, for example, the etching stopper film.

In the above description of the embodiments, the silicon substrate is used. However, an SOI substrate or a silicon substrate including a SiGe area may also be used.

The above description of the embodiments relates to the NAND type flash memory. However, the present invention is applicable to flash memories (for example, a NOR type) other than the NAND type. The present invention is also applicable to semiconductor devices other than the flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:

coating a solution containing a perhydrosilazane polymer on a substrate;

heating the solution to form a film containing the perhydrosilazane polymer; and oxidizing the film to convert the film into an insulating film containing silicon and oxygen, wherein the oxidizing comprises a first oxidation treatment and a second oxidation treatment, the first oxidation treatment is executed in a water vapor atmosphere at a reduced pressure, and the second oxidation treatment is executed in a water vapor atmosphere at a reduced pressure at a higher temperature than the first oxidation treatment, wherein a top portion of the film includes Si—N bonds after the first oxidation treatment and before the second oxidation treatment, and the top portion of the film fails to include Si—N bonds after the second oxidation treatment.

2. The method for manufacturing a semiconductor device according to claim 1, wherein the insulating film is an isolation insulating film or an interlayer insulating film.

3. The method for manufacturing a semiconductor device according to claim 1, wherein the second oxidation treatment is executed at a pressure equal to or lower than that for the first oxidation treatment.

4. The method for manufacturing a semiconductor device according to claim 1, wherein the first oxidation treatment is executed at a pressure of 20 to 40 KPa and the second oxidation treatment is executed at a pressure of 20 to 40 KPa, and a pressure for the second oxidation treatment is set equal to or lower than that for the first oxidation treatment.

5. The method for manufacturing a semiconductor device according to claim 4, wherein the first oxidation treatment is executed at a temperature of 220 to 280° C., and the second oxidation treatment is executed at a temperature of 500 to 580° C.

6. The method for manufacturing a semiconductor device according to claim 5, further comprising wet-etching or polishing the insulating film.

7. The method for manufacturing a semiconductor device according to claim 4, wherein the first oxidation treatment and the second oxidation treatment are consecutively executed in the same apparatus.

8. The method for manufacturing a semiconductor device according to claim 4, wherein the first oxidation treatment and the second oxidation treatment are executed in a batch type diffusion furnace.

9. The method for manufacturing a semiconductor device according to claim 4, wherein the first oxidation treatment includes introducing a water vapor atmosphere into the diffusion furnace a given time after a temperature of the diffusion furnace into which the substrate or semiconductor substrate has been introduced reaches 220 to 280° C.

10. A method for manufacturing a semiconductor device comprising:

forming an isolation trench in a surface of a semiconductor substrate;

coating a solution containing a perhydrosilazane polymer on the semiconductor substrate to fill the isolation trench with the solution;

heating the solution to form a film containing the perhydrosilazane polymer and which fills the isolation trench; and oxidizing the film to convert the film into an insulating film containing silicon and oxygen, wherein the oxidizing comprises a first oxidation treatment and a second oxidation treatment, the first oxidation treatment is executed in a water vapor atmosphere at a reduced pressure, and wherein the second oxidation treatment is executed in a water vapor atmosphere at a reduced pressure at a higher temperature than the first oxidation treatment, wherein a top portion of the film includes Si—N bonds after the first oxidation treatment and before the second oxidation treatment, and the top portion of the film fails to include Si—N bonds after the second oxidation treatment.

11. The method for manufacturing a semiconductor device according to claim 10, further comprising forming a gate dielectric film isolated by the isolation trench before oxidizing the film in the water vapor atmosphere at the reduced pressure.

12. A method for manufacturing a semiconductor device comprising:

forming an isolation trench in a surface of a semiconductor substrate;

coating a solution containing a perhydrosilazane polymer on the semiconductor substrate to fill the isolation trench with the solution;

heating the solution to form a film containing the perhydrosilazane polymer and filling the isolation trench;

oxidizing the film in a water vapor atmosphere at a reduced pressure to convert the film into an insulating film containing silicon and oxygen; and filling a silicon oxide film into a part of the isolation trench by an HDP-CVD process before coating the solution containing the perhydrosilazane polymer on the semiconductor substrate.

13. The method for manufacturing a semiconductor device according to claim 10, wherein the first oxidation treatment is executed at a pressure of 20 to 40 KPa and the second oxidation treatment is executed at a pressure of 20 to 40 KPa, and a pressure for the second oxidation treatment is set equal to or lower than that for the first oxidation treatment.

14. The method for manufacturing a semiconductor device according to claim 13, wherein the first oxidation treatment is executed at a temperature of 220 to 280° C., and the second oxidation treatment is executed at a temperature of 500 to 580° C.

15. The method for manufacturing a semiconductor device according to claim 14, further comprising wet-etching or polishing the insulating film.

16. The method for manufacturing a semiconductor device according to claim 13, wherein the first oxidation treatment and the second oxidation treatment are consecutively executed in the same apparatus.

17. The method for manufacturing a semiconductor device according to claim 13, wherein the first oxidation treatment and the second oxidation treatment are executed in a batch type diffusion furnace.

18. The method for manufacturing a semiconductor device according to claim 13, wherein the first oxidation treatment includes introducing a water vapor atmosphere into the diffusion furnace a given time after a temperature of the diffusion furnace into which the substrate or semiconductor substrate has been introduced reaches 220 to 280° C.

19. The method for manufacturing a semiconductor device according to claim 1, wherein the second oxidation treatment is executed after the first oxidation treatment.

20. The method for manufacturing a semiconductor device according to claim 10, wherein the second oxidation treatment is executed after the first oxidation treatment.

* * * * *